(12) United States Patent
Tokuda

(10) Patent No.: US 10,224,428 B2
(45) Date of Patent: Mar. 5, 2019

(54) SEMICONDUCTOR DEVICE AND METHOD OF MANUFACTURING THE SAME

(71) Applicant: Renesas Electronics Corporation, Tokyo (JP)

(72) Inventor: Satoru Tokuda, Hitachinaka (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/723,662

(22) Filed: Oct. 3, 2017

(65) Prior Publication Data
US 2018/0138311 A1    May 17, 2018

(30) Foreign Application Priority Data
Nov. 14, 2016   (JP) ................. 2016-221329

(51) Int. Cl.
*H01L 29/00* (2006.01)
*H01L 29/78* (2006.01)
*H01L 29/66* (2006.01)
*H01L 21/768* (2006.01)
*H01L 23/535* (2006.01)

(52) U.S. Cl.
CPC ...... *H01L 29/7813* (2013.01); *H01L 21/7688* (2013.01); *H01L 21/76802* (2013.01); *H01L 21/76895* (2013.01); *H01L 23/535* (2013.01); *H01L 29/66734* (2013.01)

(58) Field of Classification Search
None
See application file for complete search history.

(56) References Cited

U.S. PATENT DOCUMENTS 5,998,833 A    12/1999  Baliga
8,410,546 B2    4/2013  Kawaguchi et al.

FOREIGN PATENT DOCUMENTS

JP    2009-260271 A    11/2009

*Primary Examiner* — Reema Patel
(74) *Attorney, Agent, or Firm* — Sughrue Mion, PLLC

(57) ABSTRACT

The present invention provides a semiconductor device that can reduce effects of noise without complicating processes or increasing chip area.

The semiconductor device according to an aspect of the present invention includes a semiconductor substrate, a drain region, a drift region, a base region, a source region, a gate electrode, an interlayer insulating film, a conductive layer electrically coupled to the drain region, a wiring line, and a contact plug electrically coupled to the source region and the wiring line. The interlayer insulating film has an intermediate interlayer insulating film. The intermediate interlayer insulating film is arranged between the conductive layer and the contact plug. The intermediate interlayer insulating film is a thermal oxide film of a material that forms the conductive layer.

12 Claims, 28 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2016-221329 filed on Nov. 14, 2016 including the specification, drawings and abstract is incorporated herein by reference in its entirety.

BACKGROUND

The present invention relates to a semiconductor device and a method of manufacturing the same.

As a power semiconductor device, for example, a trench gate type vertical MOSFET (Metal Oxide Semiconductor Field Effect Transistor) is known in the related art.

When noise occurs in the trench gate type vertical MOSFET, the noise passes through junction capacitance of a pn junction formed between a drift region and a base region. However, when the frequency of the noise is low, the impedance of the junction capacitance is large. As a result, there is a problem that that the noise is difficult to pass through the junction capacitance.

As semiconductor devices for solving the problem, a semiconductor device described in Patent Document 1 (Japanese Unexamined Patent Application Publication No. 2009-260271) and a semiconductor device described in Patent Document 2 (U.S. Pat. No. 5,998,833) are proposed.

A semiconductor substrate of the semiconductor device described in Japanese Unexamined Patent Application Publication No. 2009-260271 has a trench MOS region where a trench gate type vertical MOSFET is formed and a capacitance forming region. In the capacitance forming region, the semiconductor substrate has a trench formed from a first surface to a second surface in a drift region, an insulating film formed on a surface of the trench, and a conductive layer formed over the insulating film. The conductive layer has a source potential. Therefore, a source-drain capacitance is formed between the conductive layer and the drift region.

The semiconductor device described in U.S. Pat. No. 5,998,833 has a gate electrode which faces a part of a base region sandwiched between a source region and a drift region and is insulated from the part of the base region and a conductive layer which faces the drift region and is insulated from the drift region in a semiconductor substrate. The gate electrode and the conductive layer are formed in a trench formed from a first surface to a second surface of the semiconductor substrate. The conductive layer has a source potential. The conductive layer is arranged closer to the second surface than the gate electrode. Therefore, a source-drain capacitance is formed between the conductive layer and the drift region.

SUMMARY

According to the semiconductor devices described in Japanese Unexamined Patent Application Publication No. 2009-260271 and U.S. Pat. No. 5,998,833, an additional capacitance is formed between the source and the drain, so that effects of noise are reduced. However, in the semiconductor device described in Japanese Unexamined Patent Application Publication No. 2009-260271, the additional capacitance is formed outside the trench MOS region, so that there is a problem that the chip area increases.

Further, in the semiconductor device described in U.S. Pat. No. 5,998,833, it is necessary to form the trench deeper than a trench of a normal trench gate type vertical MOSFET and it is necessary to repeat forming and etching of insulating film in the trench a plurality of times, so that there is a problem that processes are complicated.

The other problems and novel features will become apparent from the description of the present specification and the accompanying drawings.

A semiconductor device according to an embodiment includes a semiconductor substrate, a drain region, a drift region, a base region, a source region, a gate electrode, an interlayer insulating film, a conductive layer, a contact plug, and a wiring line.

A semiconductor substrate has a first surface and a second surface. The second surface is an opposite surface of the first surface. The drain region is arranged in the semiconductor substrate. The drain region has a first conductivity type. The drift region is arranged on a side of the drain region facing the first surface in the semiconductor substrate. The drift region has the first conductivity type. The base region is arranged on a side of the drift region facing the first surface in the semiconductor substrate. The base region has a second conductivity type. The second conductivity type is a conductivity type opposite to the first conductivity type. The source region is arranged on a side of the base region facing the first surface so that the base region is sandwiched between the source region and the drift region in the semiconductor substrate. The source region has the first conductivity type.

The gate electrode faces apart of the base region sandwiched between the source region and the drift region while being insulated from the part of the base region. The interlayer insulating film is arranged over the first surface. The wiring line is arranged over the interlayer insulating film. The conductive layer is arranged in the interlayer insulating film. The conductive layer is formed of a conductor which changes into an insulator when being oxidized. The conductive layer is electrically coupled to the drain region. The contact plug is arranged in the interlayer insulating film and is electrically coupled to the source region and the wiring line.

The interlayer insulating film has an intermediate interlayer insulating film. The intermediate interlayer insulating film is arranged between the conductive layer and the contact plug. The intermediate interlayer insulating film is a thermal oxide film of a material that forms the conductive layer.

According to the semiconductor device according to the embodiment, it is possible to reduce effects of noise without complicating processes or increasing chip area.

DETAILED DESCRIPTION

Figure 1:
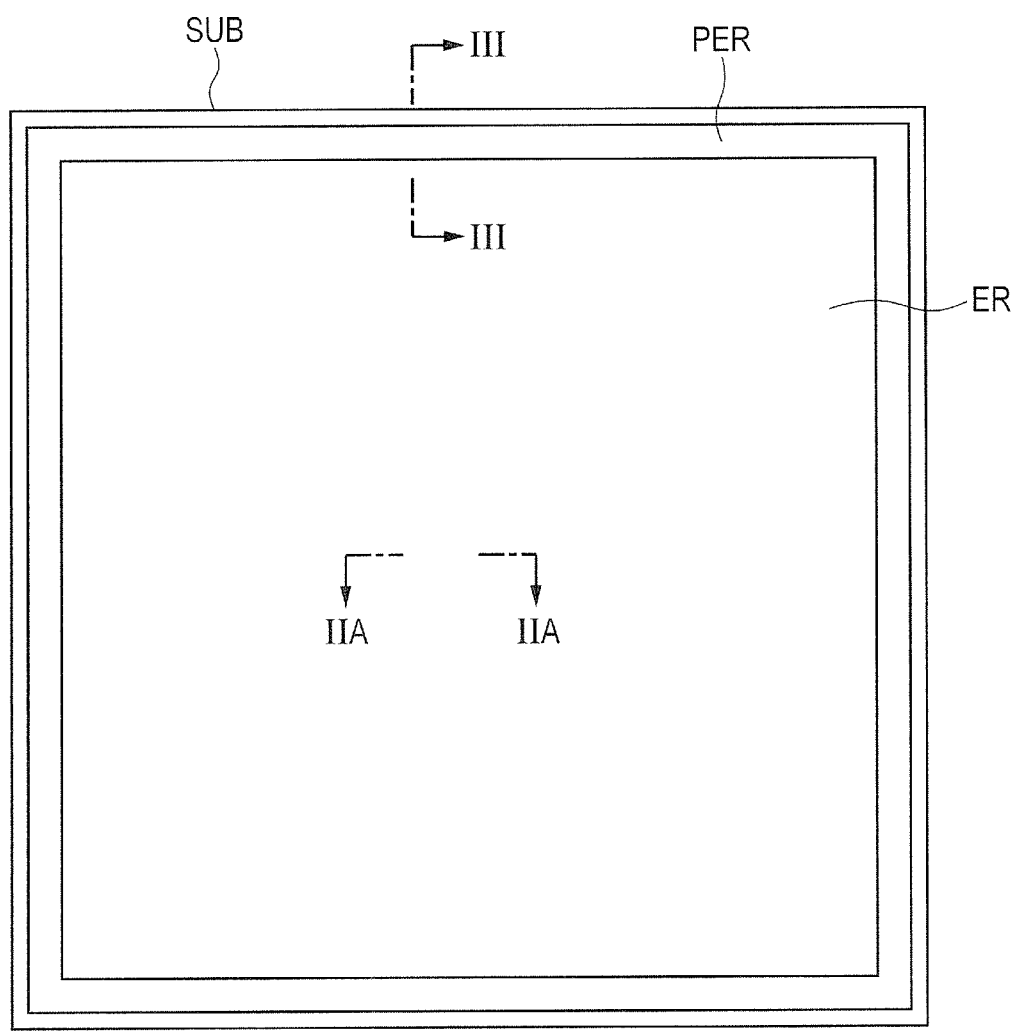
FIG. 1 is a top view of a semiconductor device according to an embodiment.

Hereinafter, an embodiment will be described with reference to the drawings. The same reference symbols are given to the same or corresponding portions in the drawings. At least parts of the embodiment described below may be arbitrarily combined.

(Configuration of Semiconductor Device According to Embodiment)

Hereinafter, a configuration of a semiconductor device according to an embodiment will be described.

As shown in FIG. 1, the semiconductor device according to the embodiment has a semiconductor substrate SUB. For example, single-crystal silicon (Si) is used for the semiconductor substrate SUB. However, material used for the semiconductor substrate SUB is not limited to this. For example, silicon carbide (SiC) or the like can be used for the semiconductor substrate SUB.

The semiconductor device according to the embodiment has an element region ER and an outer peripheral region PER. The element region ER is a region where a semiconductor element such as MOSFET is formed. The outer peripheral region PER is a region that surrounds an outer periphery of the element region ER in plan view. A semiconductor element such as MOSFET is not formed in the outer peripheral region PER.

Figure 2A:
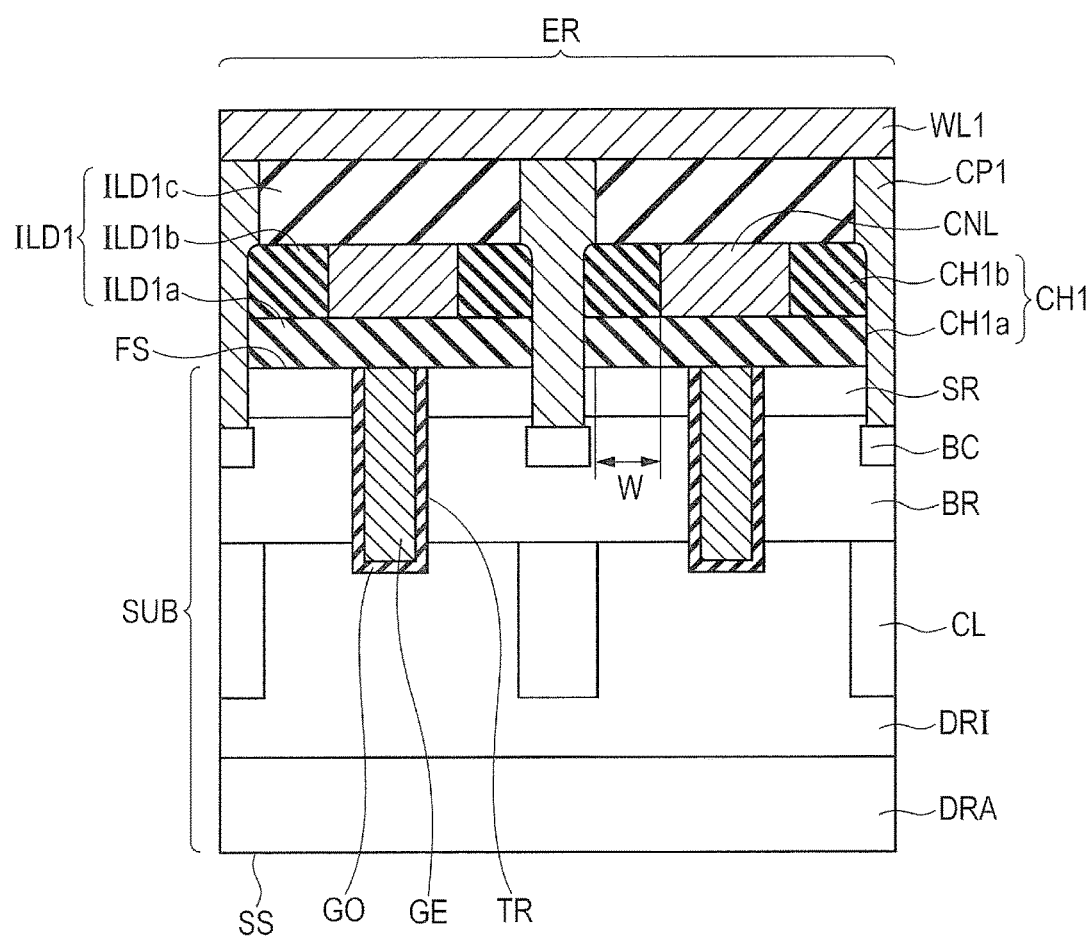
FIG. 2A is a cross-sectional view taken along line IIA-IIA in FIG. 1.

As shown in FIG. 2A, the semiconductor substrate SUB has a first surface FS and a second surface SS. The second surface SS is an opposite surface of the first surface FS. In the semiconductor substrate SUB, a drain region DRA, a drift region DRI, a base region BR, and a source region SR are formed in the element region ER. In the semiconductor substrate SUB, a column region CL and a base contact region BC may be formed in the element region ER.

The drain region DRA, the drift region DRI, and the source region SR have a first conductivity type. The first conductivity type is, for example, n-type. The base region BR, the base contact region BC, and the column region CL have a second conductivity type. The second conductivity type is a conductivity type opposite to the first conductivity type. For example, when the first conductivity type is n-type, the second conductivity type is p-type.

The drain region DRA is arranged in the semiconductor substrate SUB. In the semiconductor substrate SUB, the drain region DRA is arranged on the second surface SS.

Specifically, the drain region DRA is provided in contact with the second surface SS in the semiconductor substrate SUB.

The drift region DRI is arranged on a surface of the drain region DRA facing the first surface FS in the semiconductor substrate SUB. More specifically, the drift region DRI is arranged in contact with the surface of the drain region DRA facing the first surface FS.

The base region BR is arranged on a surface of the drift region DRI facing the first surface FS in the semiconductor substrate SUB. More specifically, the base region BR is arranged in contact with the surface of the drift region DRI facing the first surface FS.

The source region SR is arranged on a surface of the base region BR facing the first surface FS in the semiconductor substrate SUB. Specifically, the source region SR is arranged in contact with the first surface FS over the base region BR. The source region SR is arranged so that the base region BR is sandwiched between the source region SR and the drift region DRI. From another point of view, the base region BR has a portion sandwiched by the source region SR and the drift region DRI.

The base contact region BC is arranged in the base region BR. The column region CL extends from the base region BR toward the second surface SS.

It is preferable that the impurity concentration in the drift region DRI is lower than those in the source region SR and the drain region DRA. Thereby, it is possible to secure a withstand voltage of the semiconductor device according to the embodiment.

When the column region CL is formed, a depletion layer extends laterally from the column region CL toward the drift region DRI. Therefore, in this case, even when the impurity concentration is high in the drift region DRI, it is possible to secure the withstand voltage. Thereby, it is possible to lower on-resistance while securing the withstand voltage.

The semiconductor device according to the embodiment has a gate electrode GE. The gate electrode GE is, for example, polycrystalline Si in which impurities are doped. The impurities doped in the polycrystalline Si are preferably elements to be donors. Specifically, the impurities doped in the polycrystalline Si are, for example, group V impurities such as phosphorus (P) and arsenic (As). That is to say, it is preferable that the polycrystalline Si used for the gate electrode GE has n-type conductivity. However, the impurities doped in the polycrystalline Si used for the gate electrode GE may be group III impurities such as boron (B).

A trench TR is formed in the first surface FS. The trench TR extends toward the second surface SS. The trench TR penetrates the source region SR and the base region BR and reaches the drift region DRI. The trench TR is filled with the gate electrode GE. A gate insulating film GO is formed between the gate electrode GE that fills the trench TR and a bottom and side walls of the trench TR. The gate insulating film GO is, for example, silicon dioxide ($SiO_2$).

The configuration of the gate electrode GE is not limited to the configuration described above. The gate electrode GE may be formed so as to face portions of the base region BR sandwiched by the source region SR and the drift region DRI while being insulated from the portions.

Figure 2B:
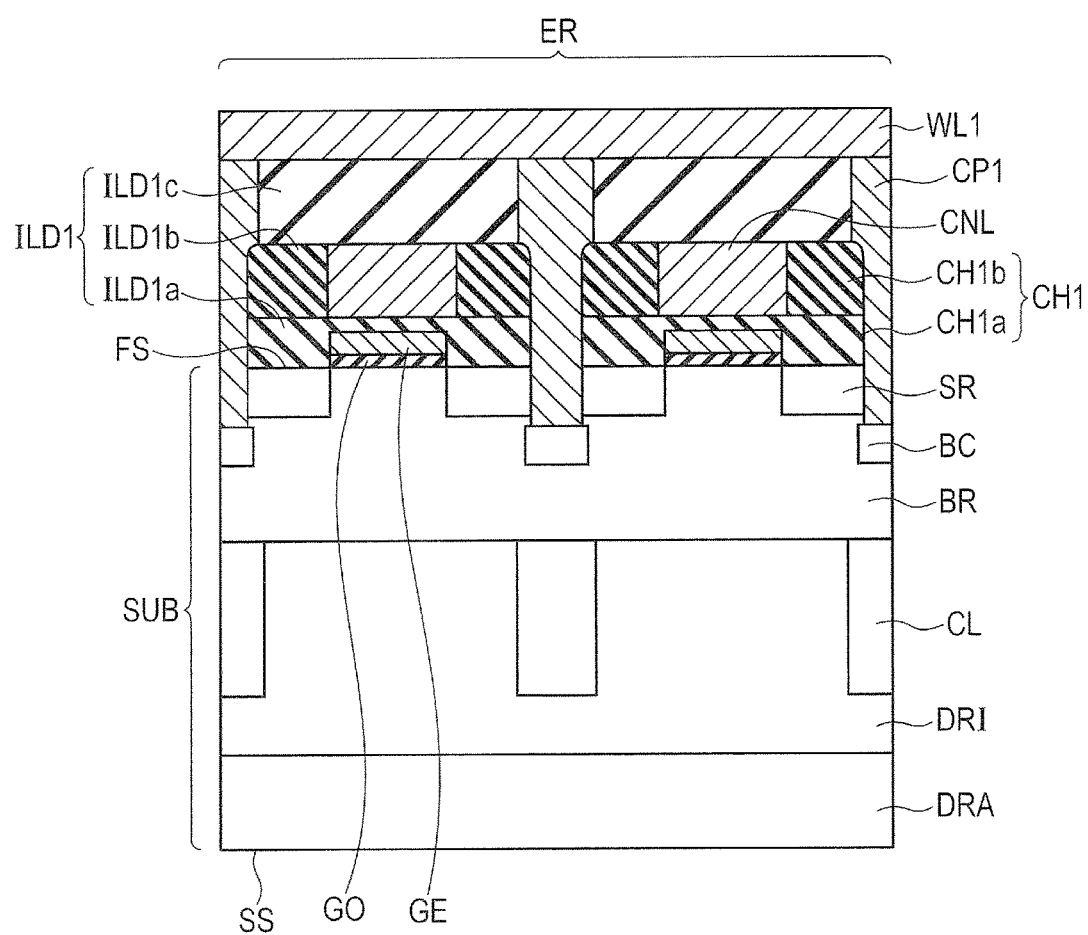
FIG. 2B is a cross-sectional view of an element region of a semiconductor device according to a first modified example of the embodiment.

For example, as shown in FIG. 2B, the trench TR need not be formed in the first surface FS of the semiconductor substrate SUB. Instead, the gate insulating film GO is formed over a portion of the base region BR sandwiched by the source region SR and the drift region DRI over the first surface FS, and the gate electrode GE is formed over the gate insulating film GO. Thereby, the gate electrode GE faces the portion of the base region BR sandwiched by the source region SR and the drift region DRI while being insulated from the portion. In other words, the semiconductor device according to the embodiment may be a planar gate type MOSFET or may be a trench gate type MOSFET.

Figure 4A:
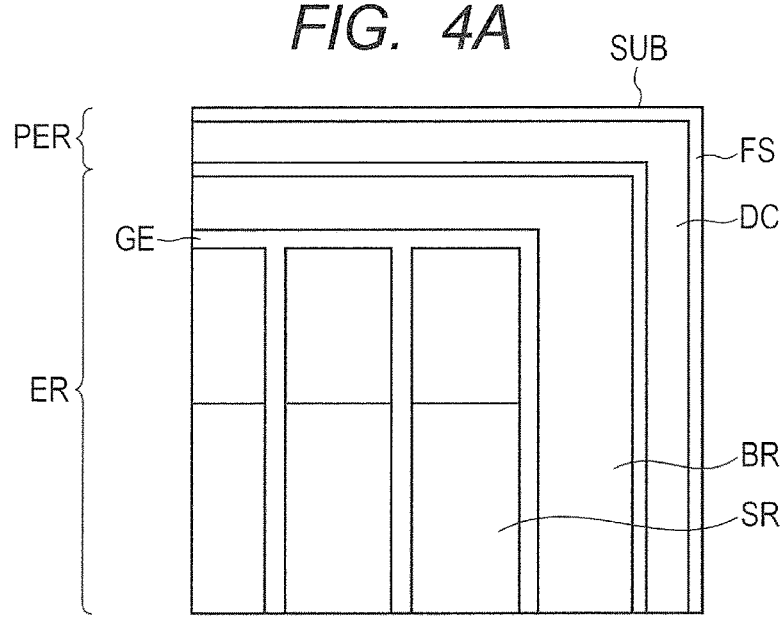
FIG. 4A is an enlarged top view of a semiconductor substrate of the semiconductor device according to the embodiment near a boundary between an element region and an outer peripheral region.
Figure 4B:
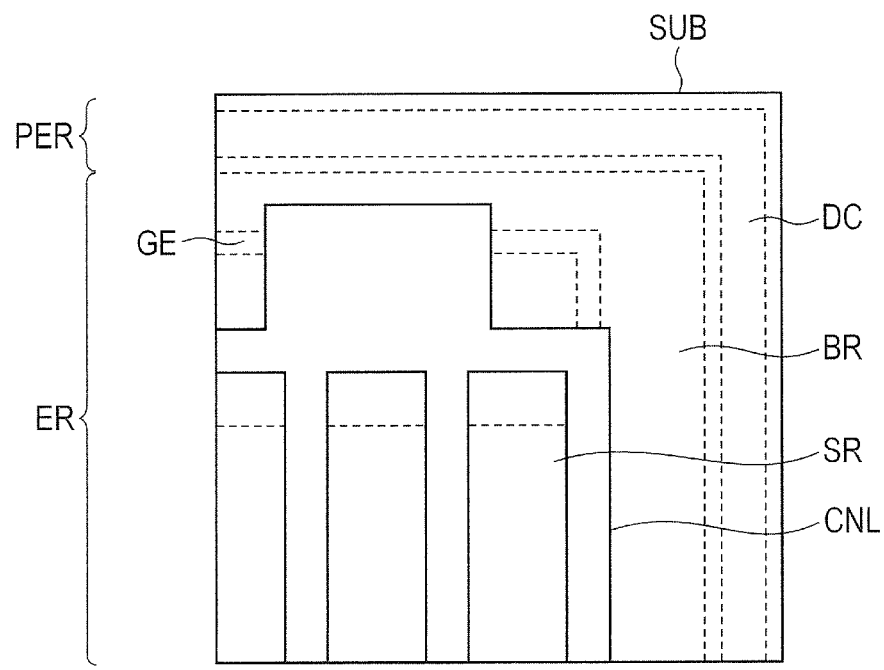
FIG. 4B is an enlarged top view of a conductive layer of the semiconductor device according to the embodiment near the boundary between the element region and the outer peripheral region.
Figure 4C:
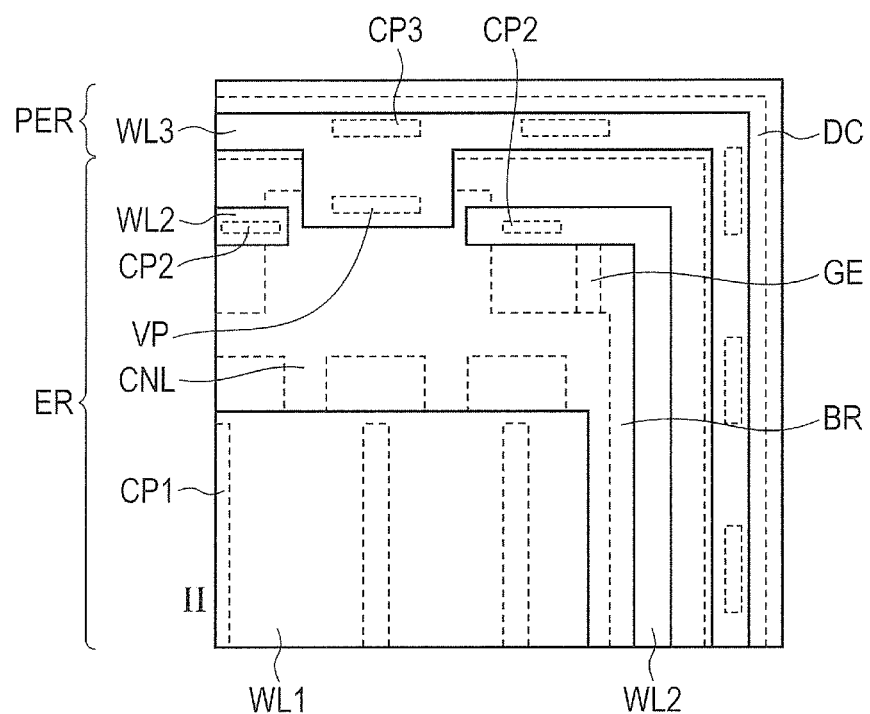
FIG. 4C is an enlarged top view of wiring of the semiconductor device according to the embodiment near the boundary between the element region and the outer peripheral region.

The semiconductor device according to the embodiment has an interlayer insulating film ILD1, a contact plug CP1, a contact plug CP2 (see FIG. 4C), a conductive layer CNL, a wiring line WL1, a wiring line WL2 (see FIG. 4C). The interlayer insulating film ILD1 is arranged over the first surface FS of the semiconductor substrate SUB. The wiring line WL1 is arranged over the interlayer insulating film ILD1. The wiring line WL2 is arranged over the interlayer insulating film ILD1. The conductive layer CNL is arranged in the interlayer insulating film ILD1. The contact plug CP1 is arranged in the interlayer insulating film ILD1. The contact plug CP2 is arranged in the interlayer insulating film ILD1. Detailed configurations of the contact plug CP2 and the wiring WL2 will be described later.

The interlayer insulating film ILD1 includes an intermediate interlayer insulating film ILD1$b$. The interlayer insulating film ILD1 may further include a lower interlayer insulating film ILD1$a$ and an upper interlayer insulating film ILD1$c$. The lower interlayer insulating film ILD1$a$ is arranged closer to the first surface FS of the semiconductor substrate SUB than the conductive layer CNL. The upper interlayer insulating film ILD1$c$ is arranged closer to the wiring line WL1 than the conductive layer CNL. The intermediate interlayer insulating film ILD1$b$ is arranged between the conductive layer CNL and the contact plug CP1.

For example, $SiO_2$ is used for the lower interlayer insulating film ILD1$a$. More specifically, HTO (High Temperature Oxide) —$SiO_2$ is used for the lower interlayer insulating film ILD1$a$. The lower interlayer insulating film ILD1$a$ is, for example, a CVD (Chemical Vapor Deposition) film. Here, the CVD film is a film formed by CVD. From another point of view, the density of the lower interlayer insulating film ILD1$a$ is lower than that of the intermediate interlayer insulating film ILD1$b$.

For example, $SiO_2$ is used for the upper interlayer insulating film ILD1$c$. More specifically, HTO—$SiO_2$, BPSG (Boron Phosphorus Silicate Glass) is used for the upper interlayer insulating film ILD1$c$. The upper interlayer insulating film ILD1$c$ is, for example, a CVD film. From another point of view, the density of the upper interlayer insulating film ILD1$c$ is lower than that of the intermediate interlayer insulating film ILD1$b$.

A thermal oxide film of a material that forms the conductive layer CNL is used for the intermediate interlayer insulating film ILD1$b$. The thermal oxide film is a film formed by thermal oxidation. From another point of view, the intermediate interlayer insulating film ILD1$b$ is formed by an oxide of a material that forms the conductive layer CNL, and the density of the intermediate interlayer insulating film ILD1$b$ is higher than those of the lower interlayer insulating film ILD1$a$ and the upper interlayer insulating film ILD1$c$.

The intermediate interlayer insulating film ILD1$b$ has a width W. The width W is a distance between a side surface of the conductive layer CNL and the contact plug CP1. The width W is appropriately selected according to a withstand voltage required between source and drain. For example, when the withstand voltage required between source and drain is 50 V, it is preferable that the width W is 0.2 μm or more and 0.5 μm or less.

A contact hole CH1 is formed in the interlayer insulating film ILD1. The contact hole CH1 penetrates the interlayer insulating film ILD1. The contact hole CH1 may penetrate the source region SR and reach the base contact region BC. The contact hole CH1 is arranged over the source region SR. That is, the contact hole CH1 may be formed so as to expose the source region SR and the base contact region BC from the interlayer insulating film ILD1.

The contact hole CH1 includes a lower contact hole CH1a and an upper contact hole CH1b. The lower contact hole CH1a is arranged in the lower interlayer insulating film ILD1a and in the semiconductor substrate SUB. The upper contact hole CH1b is arranged in the intermediate interlayer insulating film ILD1b and the upper interlayer insulating film ILD1c.

The contact plug CP1 fills the contact hole CH1, so that the contact plug CP1 is arranged in the interlayer insulating film ILD1. For example, tungsten (W) is used for the contact plug CP1. The contact plug CP1 is electrically coupled to the source region SR and the base contact region BC. Therefore, the potential of the contact plug CP1 is the same as that of the source region SR. The contact plug CP1 is electrically coupled to the wiring line WL1. Therefore, the potential of the wiring line WL1 is the same as that of the source region SR. Although not shown in the drawings, a barrier layer such as titanium (Ti) or titanium nitride (TiN) may be provided between the contact plug CP1 and a surface of the contact hole CH1.

The conductive layer CNL is arranged in the interlayer insulating film ILD1, so that the conductive layer CNL faces the contact plug CP1 and the wiring line WL1 while being insulated from the contact plug CP1 and the wiring line WL1. More specifically, an upper surface of the conductive layer CNL faces the wiring line WL1 while being insulated by the upper interlayer insulating film ILD1c. A side surface of the conductive layer CNL faces the contact plug CP1 while being insulated by the intermediate interlayer insulating film ILD1b. As described later, the potential of the conductive layer CNL is the same as that of the drain region DRA.

As described above, the potentials of the contact plug CP1 and the wiring line WL1 are the same as that of the source region SR. Therefore, the conductive layer CNL, the contact plug CP1, and the intermediate interlayer insulating film ILD1b form a source-drain capacitance, and the conductive layer CNL, the wiring line WL1, and the upper interlayer insulating film ILD1c form a source-drain capacitance.

The conductive layer CNL is formed of a material which is a conductor in an unoxidized state and which becomes an insulator when being oxidized. For example, polycrystalline Si in which impurities are doped is used for the conductive layer CNL. The impurities doped in the polycrystalline Si are preferably elements to be donors. The conductivity type of the polycrystalline Si used for the conductive layer CNL is preferably n-type. More specifically, the impurities doped in the polycrystalline Si are, for example, group V impurities such as P and As. The impurities doped in the polycrystalline Si used for the conductive layer CNL may be the same as or different from those doped in the polycrystalline Si used for the gate electrode GE. However, the impurities doped in the polycrystalline Si used for the conductive layer CNL may be group III impurities such as B.

A conductor is used for the wiring line WL1. A material used for the wiring line WL1 is, for example, Al or an Al alloy.

Figure 2C:
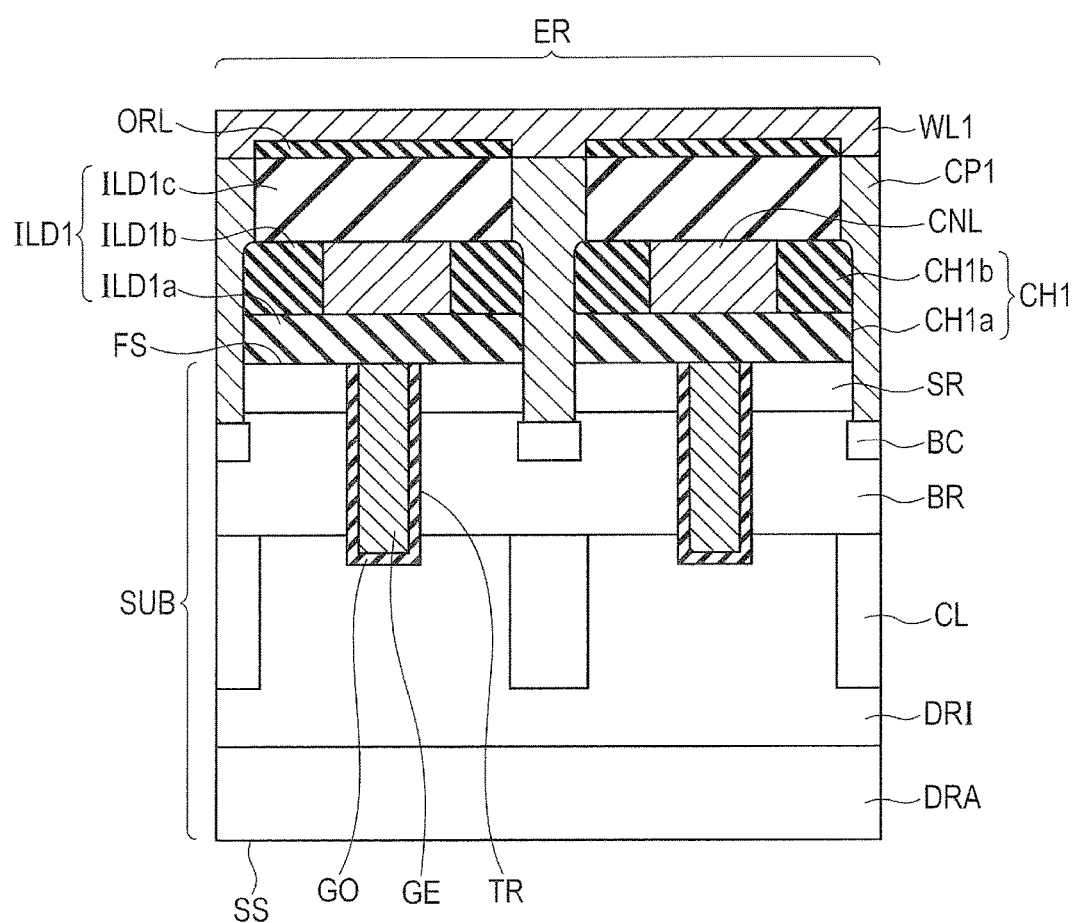
FIG. 2C is a cross-sectional view of an element region of a semiconductor device according to a second modified example of the embodiment.

As shown in FIG. 2C, the semiconductor device according to the embodiment may have an oxidation-resistant film ORL. The oxidation-resistant film ORL is arranged over the upper interlayer insulating film ILD1c. Specifically, the oxidation-resistant film ORL is arranged between the upper interlayer insulating film ILD1c and the wiring line WL1. The oxidation-resistant film ORL is formed of a material whose oxidation resistance is higher than that of a material that forms the upper interlayer insulating film ILD1c. For example, when the upper interlayer insulating film ILD1c is formed of a Si oxide film, the oxidation-resistant film ORL is preferably formed of a Si nitride film (SiN) or a Si oxynitride film (SiON).

Figure 3:
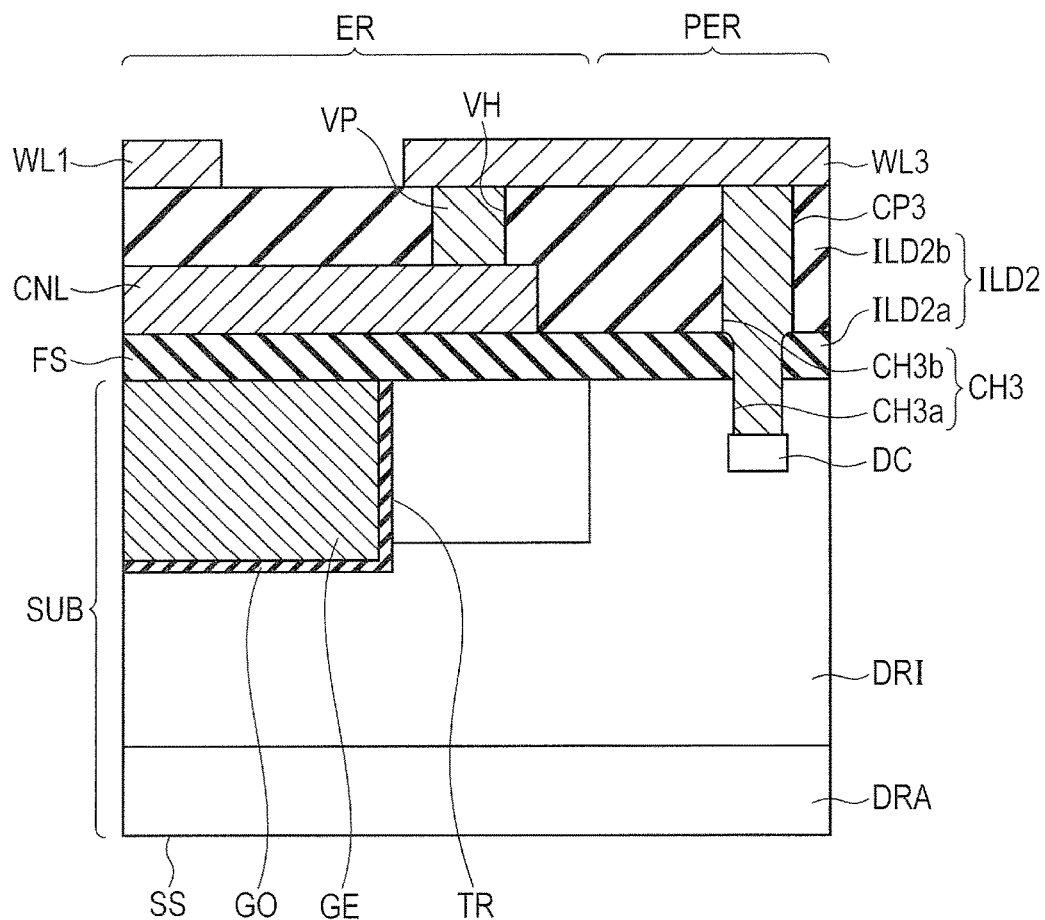
FIG. 3 is a cross-sectional view taken along line III-III in FIG. 1.

As shown in FIG. 3, the semiconductor device according to the embodiment has the semiconductor substrate SUB also in the outer peripheral region PER. In the semiconductor substrate SUB, the drain region DRA, the drift region DRI, and a drift contact region DC are formed in the outer peripheral region PER. The drift contact region DC is arranged close to the first surface FS in the semiconductor substrate SUB.

The drift contact region DC has the first conductivity type. In other words, the drift contact region DC has the same conductivity type as that of the drift region DRI and the drain region DRA. Therefore, the drift contact region DC is electrically coupled to the drain region DRA through the drift region DRI. It is preferable that the impurity concentration in the drift contact region DC is higher than that in the drift region DRI.

The semiconductor device according to the embodiment has an interlayer insulating film ILD2, a contact plug CP3, and a wiring line WL3 in the outer peripheral region PER. The interlayer insulating film ILD2 is arranged over the first surface FS of the semiconductor substrate SUB. The contact plug CP3 is arranged in the interlayer insulating film ILD2. The wiring line WL3 is arranged over the interlayer insulating film ILD2.

The interlayer insulating film ILD2 has a lower interlayer insulating film ILD2a and an upper interlayer insulating film ILD2b. The lower interlayer insulating film ILD2a is arranged over the first surface FS. The upper interlayer insulating film ILD2b is arranged over the lower interlayer insulating film ILD2a. It is preferable that the lower interlayer insulating film ILD2a has the same film quality as that of the lower interlayer insulating film ILD1a. It is preferable that the upper interlayer insulating film ILD2b has the same film quality as that of the upper interlayer insulating film ILD1c.

A contact hole CH3 is formed in the interlayer insulating film ILD2. The contact hole CH3 penetrates the interlayer insulating film ILD2. The contact hole CH3 may reach the drift contact region DC. The contact hole CH3 is arranged over the drift contact region DC. That is to say, the contact hole CH3 is formed so as to expose the drift contact region DC from the interlayer insulating film ILD2.

The contact hole CH3 has a lower contact hole CH3a and an upper contact hole CH3b. The lower contact hole CH3a is arranged in the lower interlayer insulating film ILD2a and in the semiconductor substrate SUB. The upper contact hole CH3b is arranged in the upper interlayer insulating film ILD2b.

The contact plug CP3 fills the contact hole CH3, so that the contact plug CP3 is arranged in the interlayer insulating film ILD2. For example, W is used for the contact plug CP3. The contact plug CP3 is electrically coupled to the drift contact region DC. The contact plug CP3 is electrically coupled to the wiring line WL3. As a result, the wiring line WL3 is electrically coupled to the drain region DRA through the contact plug CP3, the drift contact region DC, and the drift region DRI. Although not shown in the drawings, a barrier layer such as Ti or TiN may be provided between the contact plug CP3 and a surface of the contact hole CH3.

A conductor is used for the wiring line WL3. A material used for the wiring line WL3 is, for example, Al or an Al alloy. The wiring line WL3 extends to the element region ER over a boundary between the outer peripheral region PER and the element region ER.

The semiconductor device according to the embodiment has a via plug VP near a boundary with the outer peripheral region PER. In the upper interlayer insulating film ILD1c, a via hole VH is formed near the boundary with the outer peripheral region PER. The via plug VP fills the via hole VH, so that the via plug VP is arranged in the upper interlayer insulating film ILD1c. The via plug VP is electrically coupled to the wiring line WL3 and the conductive layer CNL. Although not shown in the drawings, a barrier layer such as Ti or TiN may be provided between the via plug VP and a surface of the via hole VH.

As described above, the wiring line WL3 is electrically coupled to the drain region DRA through the contact plug CP3, the drift contact region DC, and the drift region DRI. Therefore, the conductive layer CNL that is electrically coupled to the wiring line WL3 through the via plug VP has the same potential as that of the drain region DRA.

As shown in FIG. 4A, the base region BR, the source region SR, the drift contact region DC, and the gate electrode GE are formed on a first surface FS side of the semiconductor substrate SUB. The drift contact region DC is continuously formed so as to surround the element region ER in the outer peripheral region PER. The base region BR is formed over the entire surface of the element region ER. The gate electrode GE is formed in a comb shape in a region where the base region BR is formed. Each source region SR is formed between the gate electrodes GE.

As shown in FIG. 4B (in FIG. 4B, the base region BR, the source region SR, the drift contact region DC, and the gate electrode GE are shown by dotted lines), the conductive layer CNL is formed in a comb shape in the element region ER. The conductive layer CNL is formed so as to overlap a region, where the gate electrode GE is formed, in plan view (that is, as seen from a direction perpendicular to the first surface FS).

As shown in FIG. 4C (in FIG. 4C, the base region BR, the source region SR, the drift contact region DC, the gate electrode GE, and the conductive layer CNL are shown by dotted lines), the wiring line WL1 is formed so as to overlap a region, where the source region SR is formed, in the element region ER. The wiring line WL1 is electrically coupled to the source region SR by the contact plug CP1.

The wiring WL2 is formed so as to overlap a part of the gate electrode GE in plan view in the element region ER. The wiring WL2 is electrically coupled to the gate electrode GE by the contact plug CP2. Although not shown in the drawings, the contact plug CP2 is formed in the contact hole CH2 formed in the interlayer insulating film ILD1. The contact hole CH2 includes a lower contact hole CH2a formed in the lower interlayer insulating film ILD1a and an upper contact hole CH2b formed in the upper interlayer insulating film ILD1c.

The wiring line WL3 is formed so as to overlap the drift contact region DC in plan view in the outer peripheral region PER. The wiring line WL3 has a portion that is formed so as to overlap the conductive layer CNL in plan view in the element region ER.

A portion of the wiring line WL3 which is formed in the outer peripheral region PER is coupled to the drift contact region DC by the contact plug CP3. A portion of the wiring line WL3 which is formed so as to overlap the conductive layer CNL is electrically coupled to the conductive layer CNL by the via plug VP.

Although not shown in the drawings, the wiring line WL1 is coupled to a source electrode pad and the wiring line WL2 is coupled to a gate electrode pad.

(Method of Manufacturing Semiconductor Device According to Embodiment)

Hereinafter, a method of manufacturing a semiconductor device according to the embodiment will be described.

Figure 5:
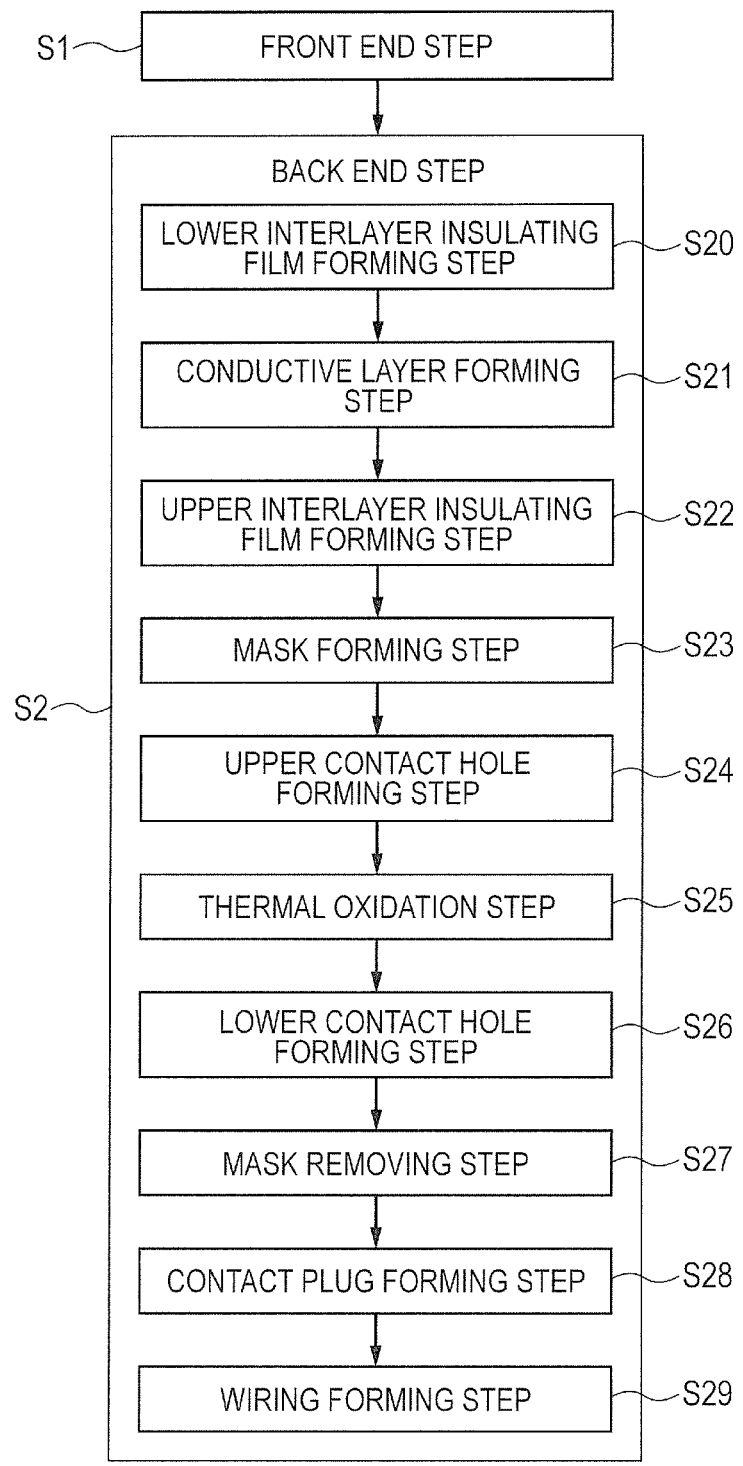
FIG. 5 is a flowchart showing a method of manufacturing the semiconductor device according to the embodiment.

As shown in FIG. 5, the method of manufacturing a semiconductor device according to the embodiment has a front end step S1 and a back end step S2.

Figure 6A:
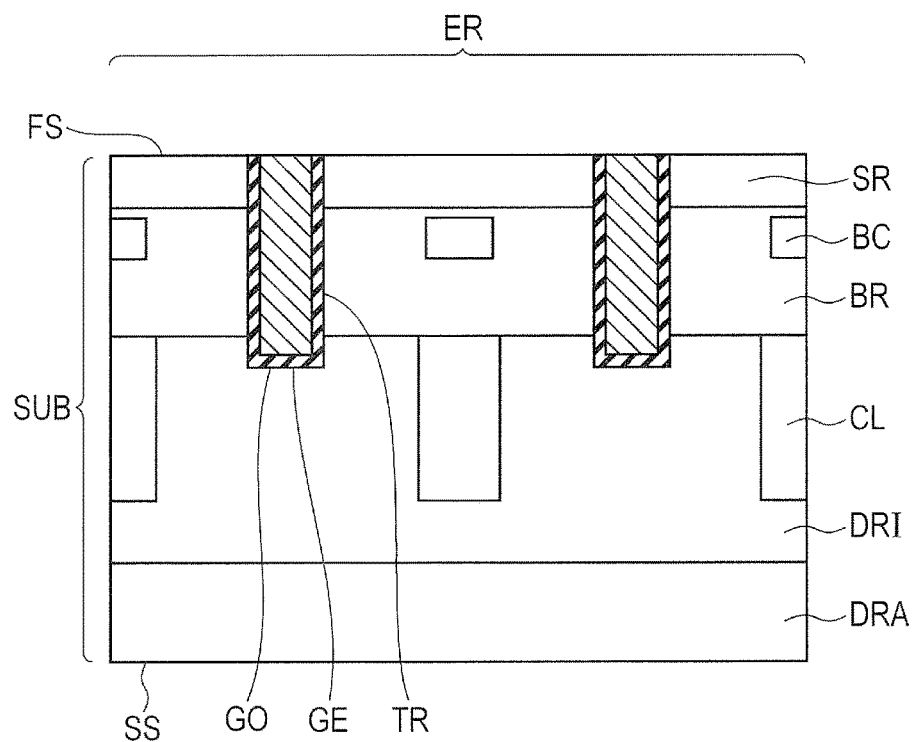
FIG. 6A is a cross-sectional view of the element region in a front end step of the semiconductor device according to the embodiment.

As shown in FIG. 6A, in the front end step S1, the drain region DRA, the drift region DRI, the base region BR, the source region SR, the base contact region BC, the column region CL, the trench TR, the gate electrode GE, and the gate insulating film GO are formed in the semiconductor substrate SUB located in the element region ER.

Figure 6B:
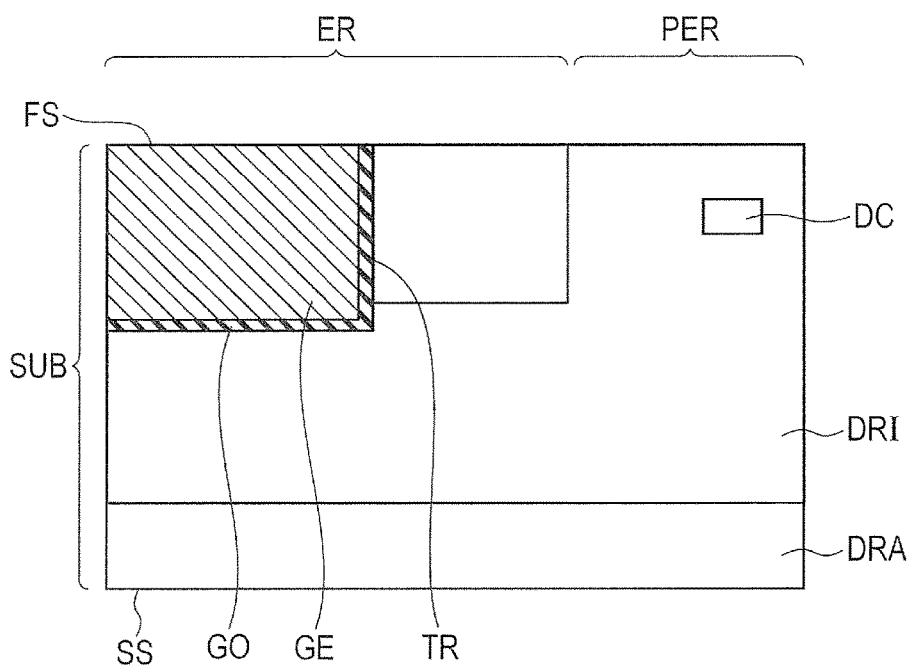
FIG. 6B is a cross-sectional view of the outer peripheral region in the front end step of the semiconductor device according to the embodiment.

As shown in FIG. 6B, in the front end step S1, the drain region DRA, the drift region DRI, and the drift contact region DC are formed in the semiconductor substrate SUB located in the outer peripheral region PER. The front end step S1 is performed by a semiconductor processing process that is commonly used.

As shown in FIG. 5, the back end step S2 has a lower interlayer insulating film forming step S20, a conductive layer forming step S21, an upper interlayer insulating film forming step S22, a mask forming step S23, an upper contact hole forming step S24, a thermal oxidation step S25, a lower contact hole forming step S26, a mask removing step S27, a contact plug forming step S28, and a wiring forming step S29.

Figure 7A:
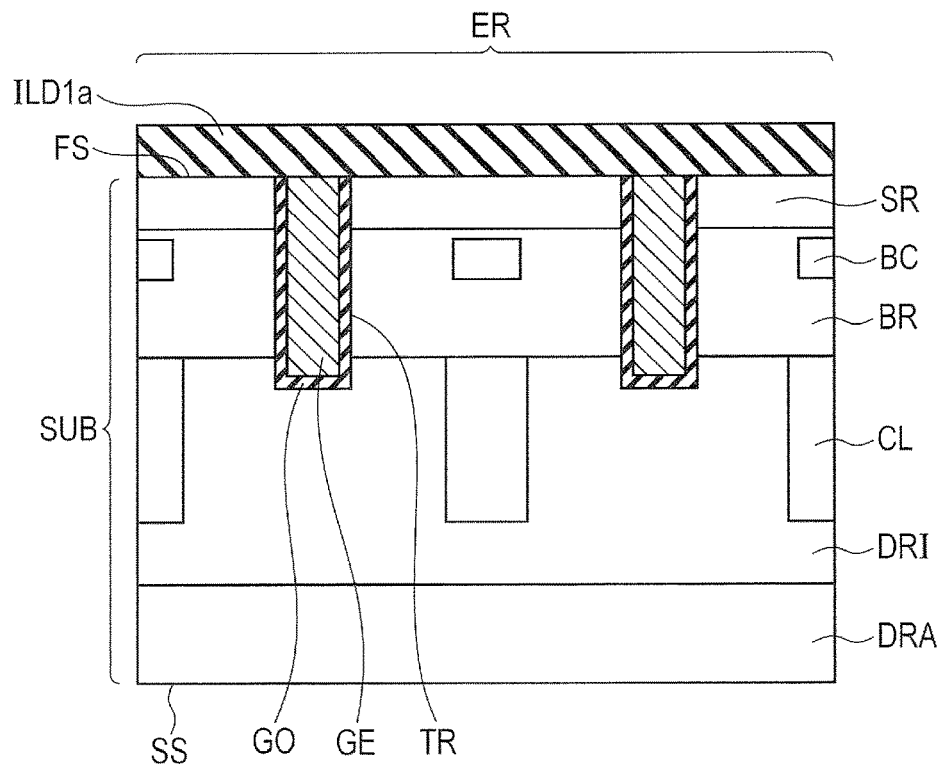
FIG. 7A is a cross-sectional view of the element region in a lower interlayer insulating film forming step of the semiconductor device according to the embodiment.
Figure 7B:
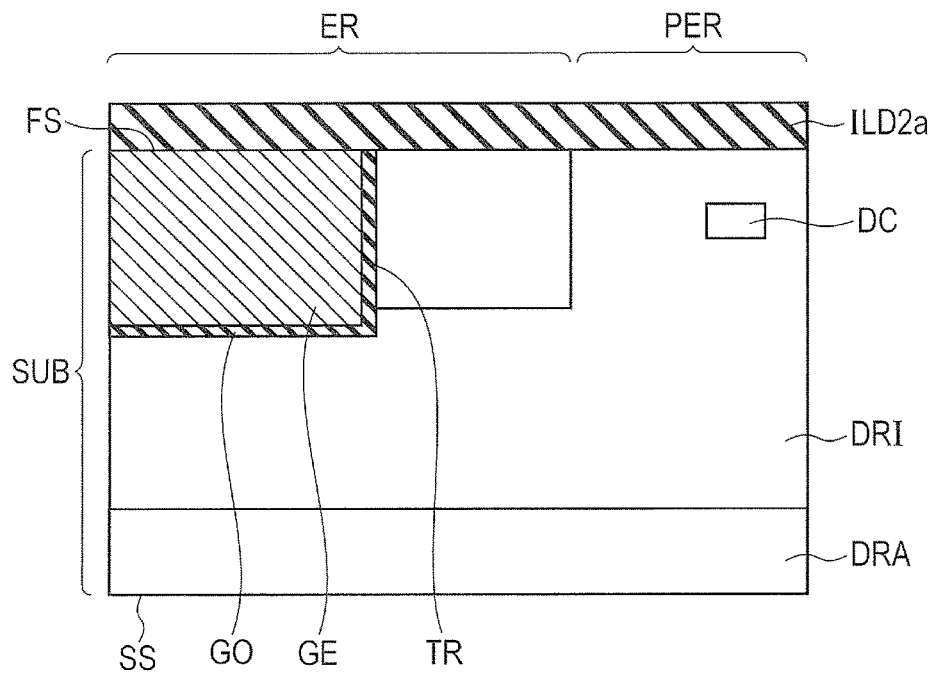
FIG. 7B is a cross-sectional view of the outer peripheral region in the lower interlayer insulating film forming step of the semiconductor device according to the embodiment.

As shown in FIG. 7A, in the lower interlayer insulating film forming step S20, the lower interlayer insulating film ILD1a is formed over the first surface FS of the semiconductor substrate SUB located in the element region ER. As shown in FIG. 7B, in the lower interlayer insulating film forming step S20, the lower interlayer insulating film ILD2a is formed over the first surface FS of the semiconductor substrate SUB located in the outer peripheral region PER. The lower interlayer insulating film ILD1a and the lower interlayer insulating film ILD2a are formed by, for example, CVD.

Figure 8:
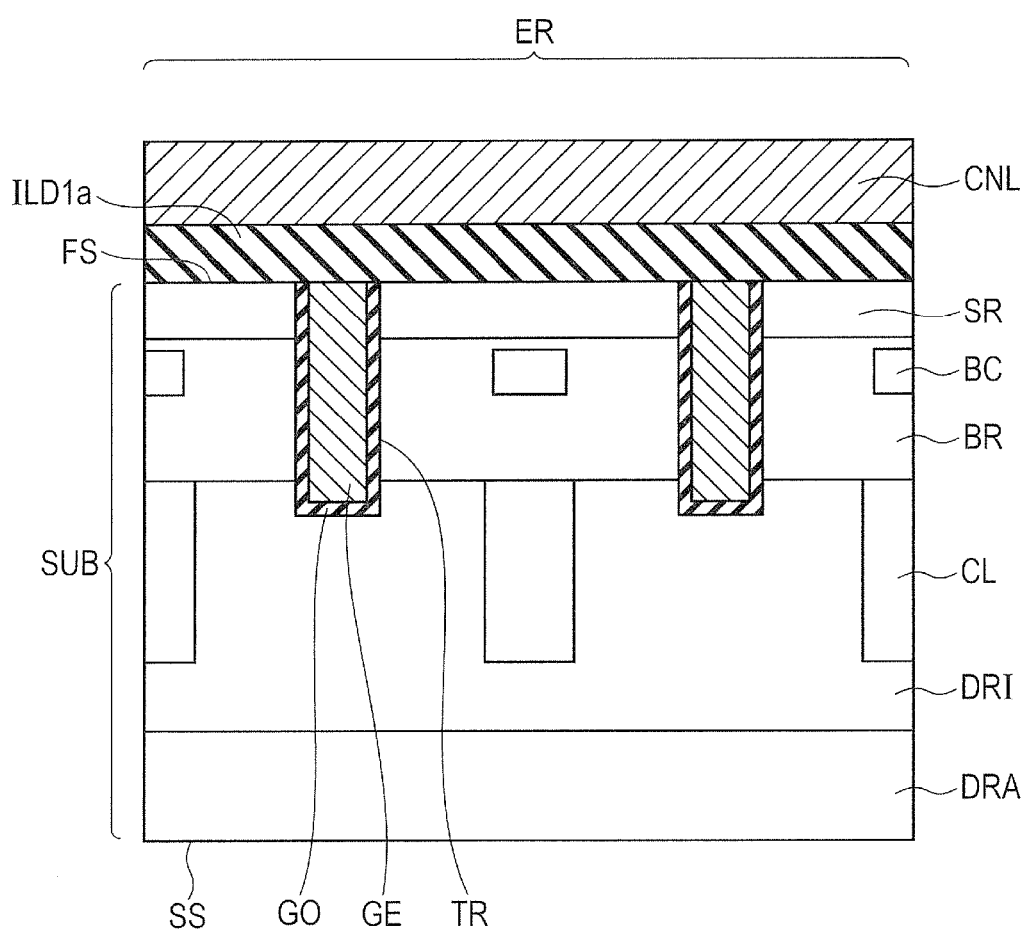
FIG. 8 is a cross-sectional view of the element region in a conductive layer forming step of the semiconductor device according to the embodiment.

As shown in FIG. 8, in the conductive layer forming step S21, the conductive layer CNL is formed over the lower interlayer insulating film ILD1a. The conductive layer CNL is formed by, for example, CVD. In the conductive layer forming step S21, a cross-sectional structure of the outer peripheral region PER is not changed, so that its illustration is omitted.

Figure 9A:
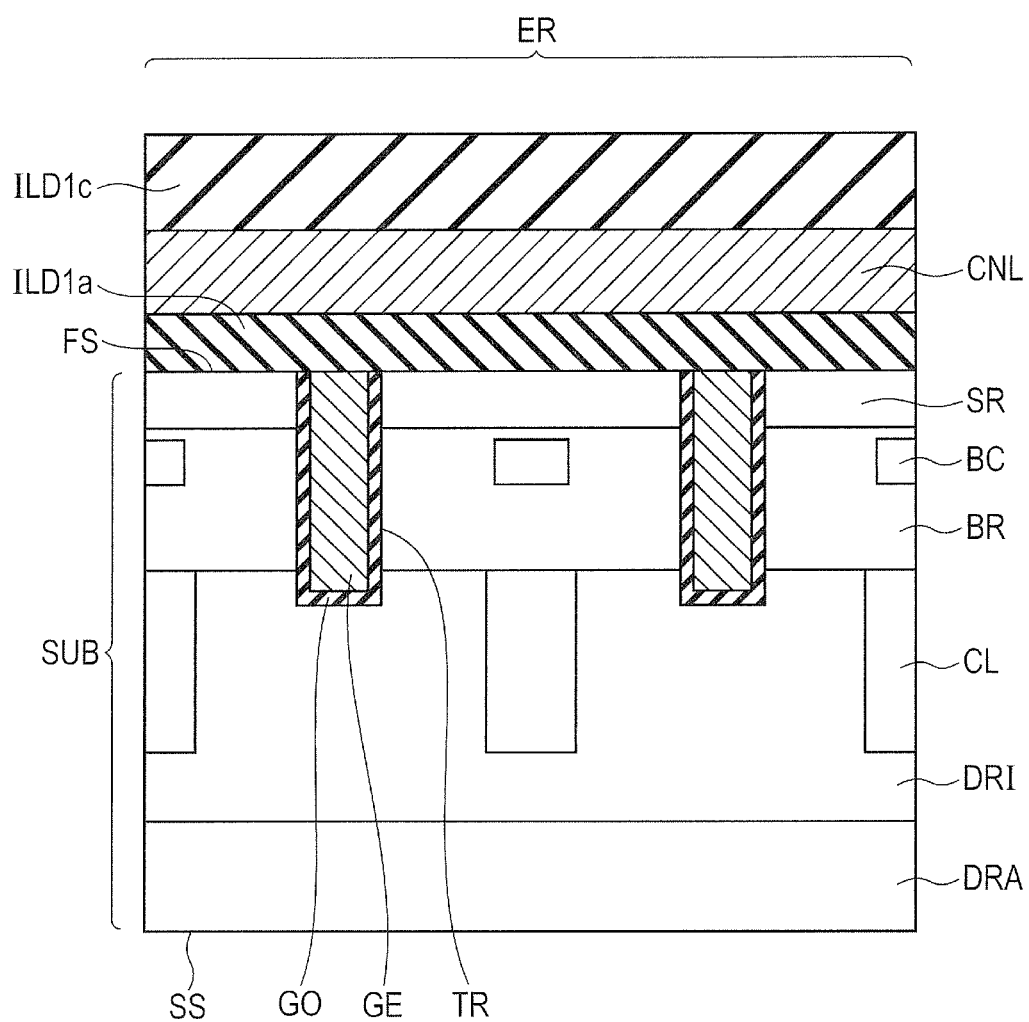
FIG. 9A is a cross-sectional view of the element region in an upper interlayer insulating film forming step of the semiconductor device according to the embodiment.
Figure 9B:
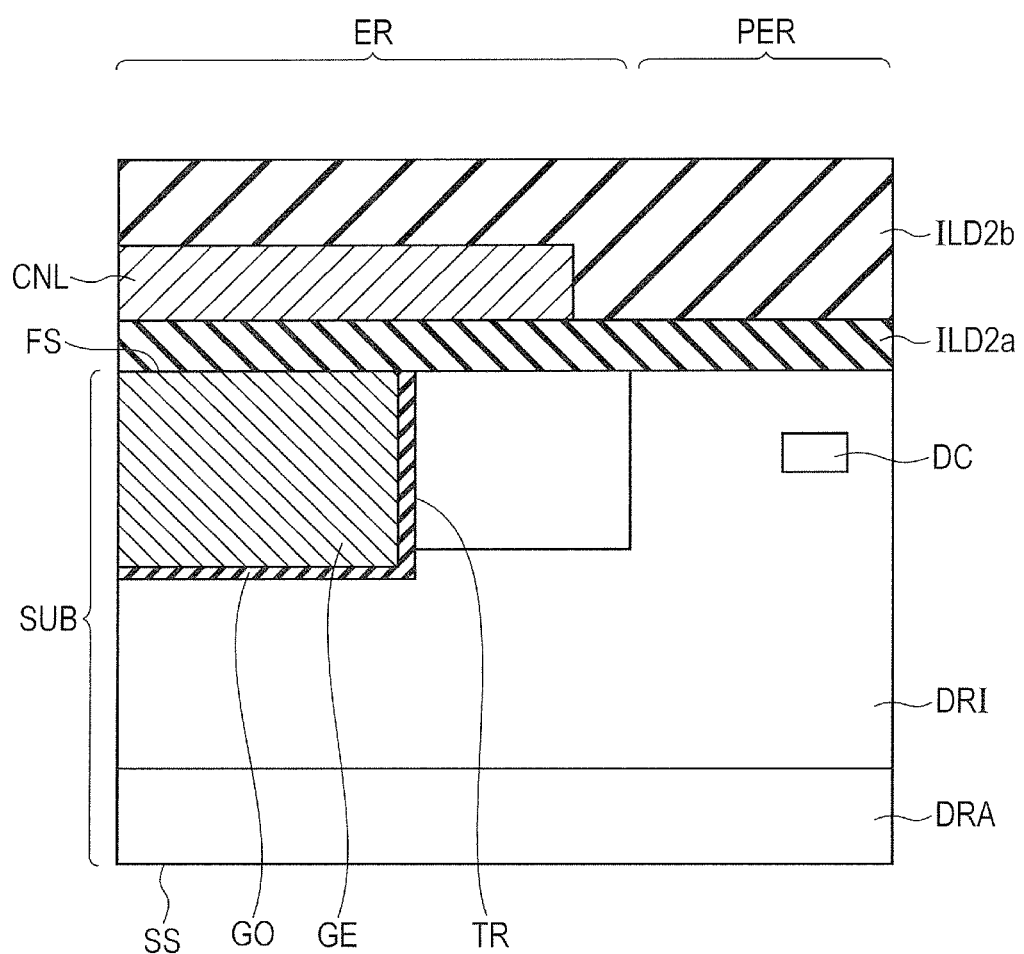
FIG. 9B is a cross-sectional view of the outer peripheral region in the upper interlayer insulating film forming step of the semiconductor device according to the embodiment.

As shown in FIG. 9A, in the upper interlayer insulating film forming step S22, the upper interlayer insulating film ILD1c is formed over the conductive layer CNL. As shown in FIG. 9B, in the upper interlayer insulating film forming step S22, the upper interlayer insulating film ILD2b is formed over the lower interlayer insulating film ILD2a. The upper interlayer insulating film ILD1c and the upper interlayer insulating film ILD2b are formed by, for example, CVD.

Figure 10A:
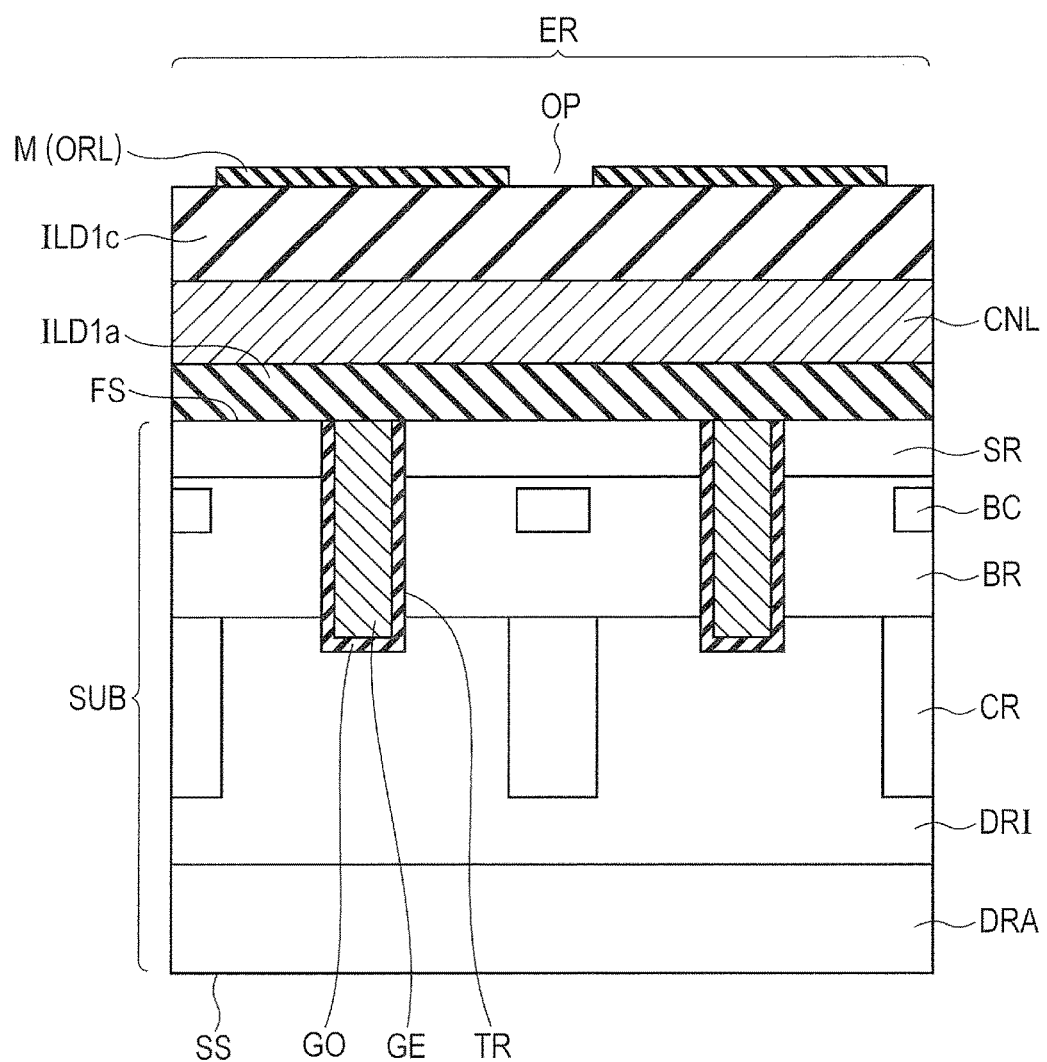
FIG. 10A is a cross-sectional view of the element region in a mask forming step of the semiconductor device according to the embodiment.
Figure 10B:
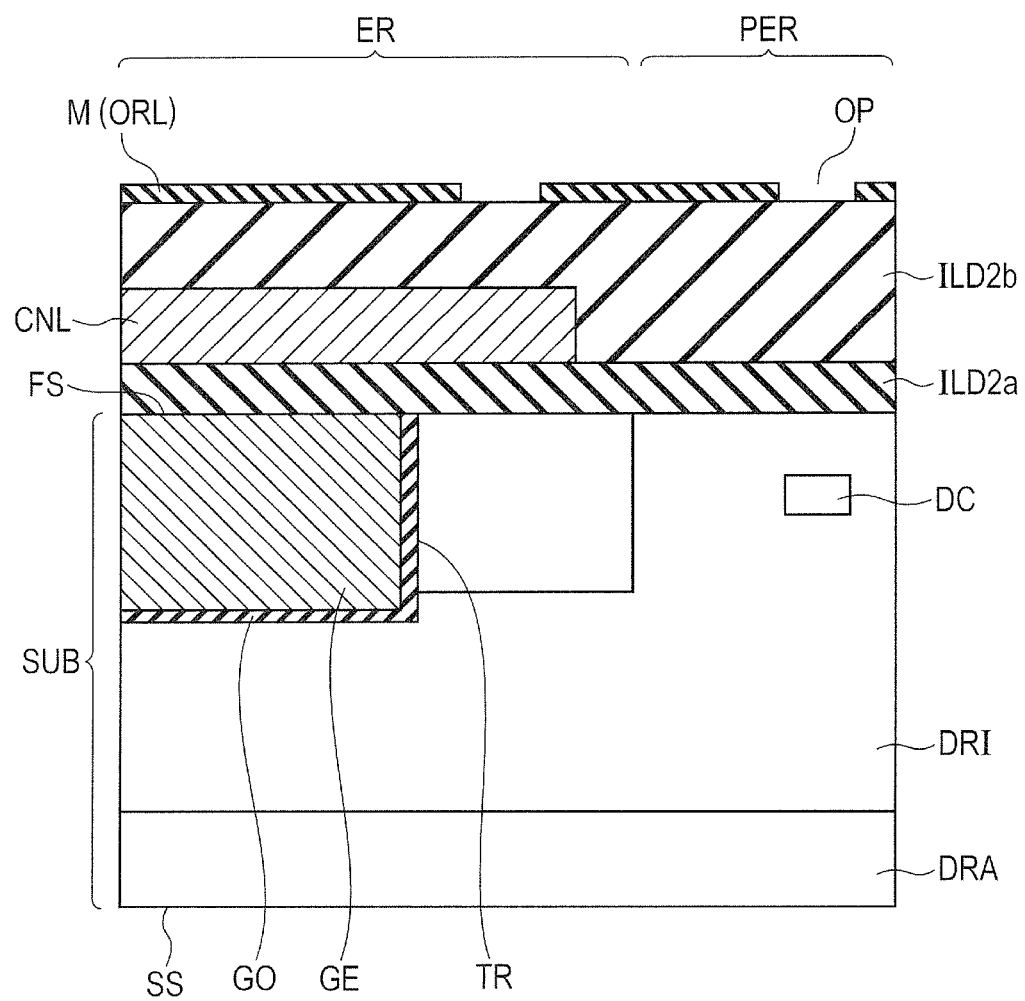
FIG. 10B is a cross-sectional view of the outer peripheral region in the mask forming step of the semiconductor device according to the embodiment.

As shown in FIGS. 10A and 10B, in the mask forming step S23, a mask M is formed over the upper interlayer insulating film ILD1c and the upper interlayer insulating film ILD2b. The mask M has an opening OP. The opening OP is formed above the source region SR, the base contact region BC, and the conductive layer CNL located near a boundary between the element region ER and the outer peripheral region PER. Although not shown in the drawings, the opening OP of the mask M is also formed above the gate electrode GE.

The mask M is preferably formed of a material (the oxidation-resistant film ORL) whose oxidation resistance is higher than that of the upper interlayer insulating film ILD1$c$. For example, when the upper interlayer insulating film ILD1$c$ is silicon oxide, the mask M is preferably formed of SiN or SiON. The mask M is formed by, for example, photolithography. The mask M may be formed of, for example, photoresist PR.

Figure 11A:
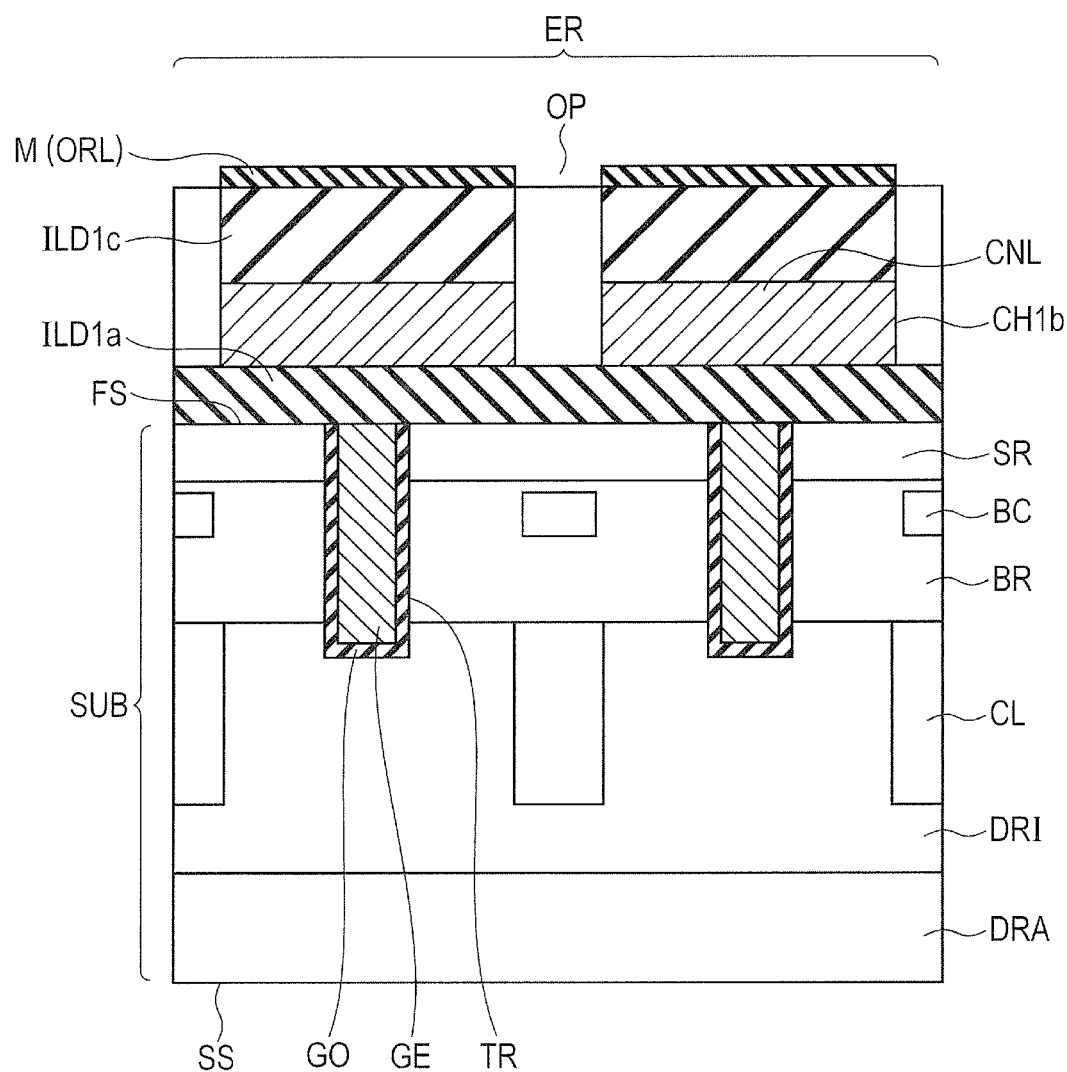
FIG. 11A is a cross-sectional view of the element region in an upper contact hole forming step of the semiconductor device according to the embodiment.

As shown in FIG. 11A, in the upper contact hole forming step S24, the upper contact hole CH1$b$ is formed in the upper interlayer insulating film ILD1$c$ and the conductive layer CNL. Thereby, the conductive layer CNL is exposed from a side wall of the upper contact hole CH1$b$. Although not shown in the drawings, in the upper contact hole forming step, the upper contact hole CH2$b$ is also formed in the upper interlayer insulating film ILD1$c$.

Figure 11B:
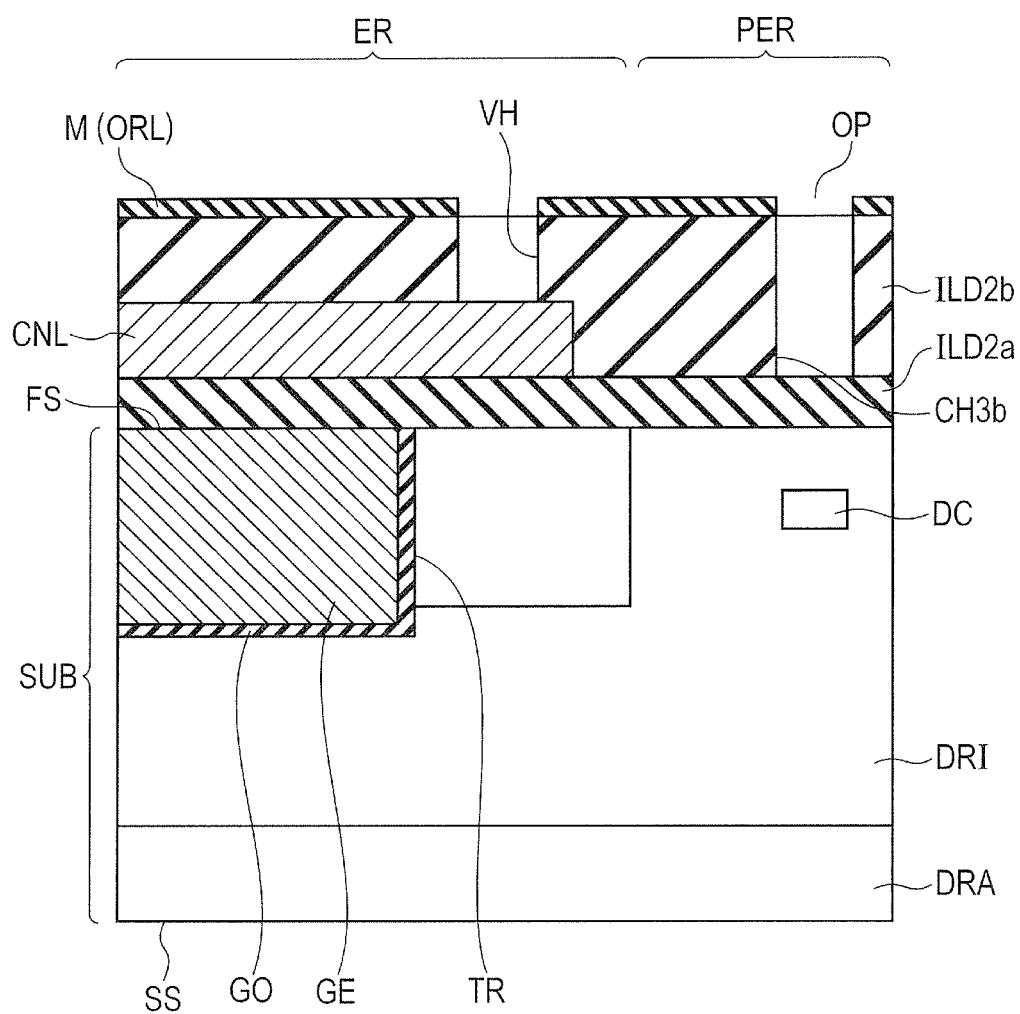
FIG. 11B is a cross-sectional view of the outer peripheral region in the upper contact hole forming step of the semiconductor device according to the embodiment.

As shown in FIG. 11B, in the upper contact hole forming step S24, the via hole VH is formed in the upper interlayer insulating film ILD1$c$ and the upper contact hole CH3$b$ is formed in the upper interlayer insulating film ILD2$b$. The upper contact hole CH1$b$, the upper contact hole CH2$b$, the upper contact hole CH3$b$, and the via hole VH are formed by performing anisotropic etching such as RIE (Reactive Ion Etching) on the upper interlayer insulating film ILD1$c$ and the upper interlayer insulating film ILD2$b$ through the opening OP of the mask M.

Figure 12:
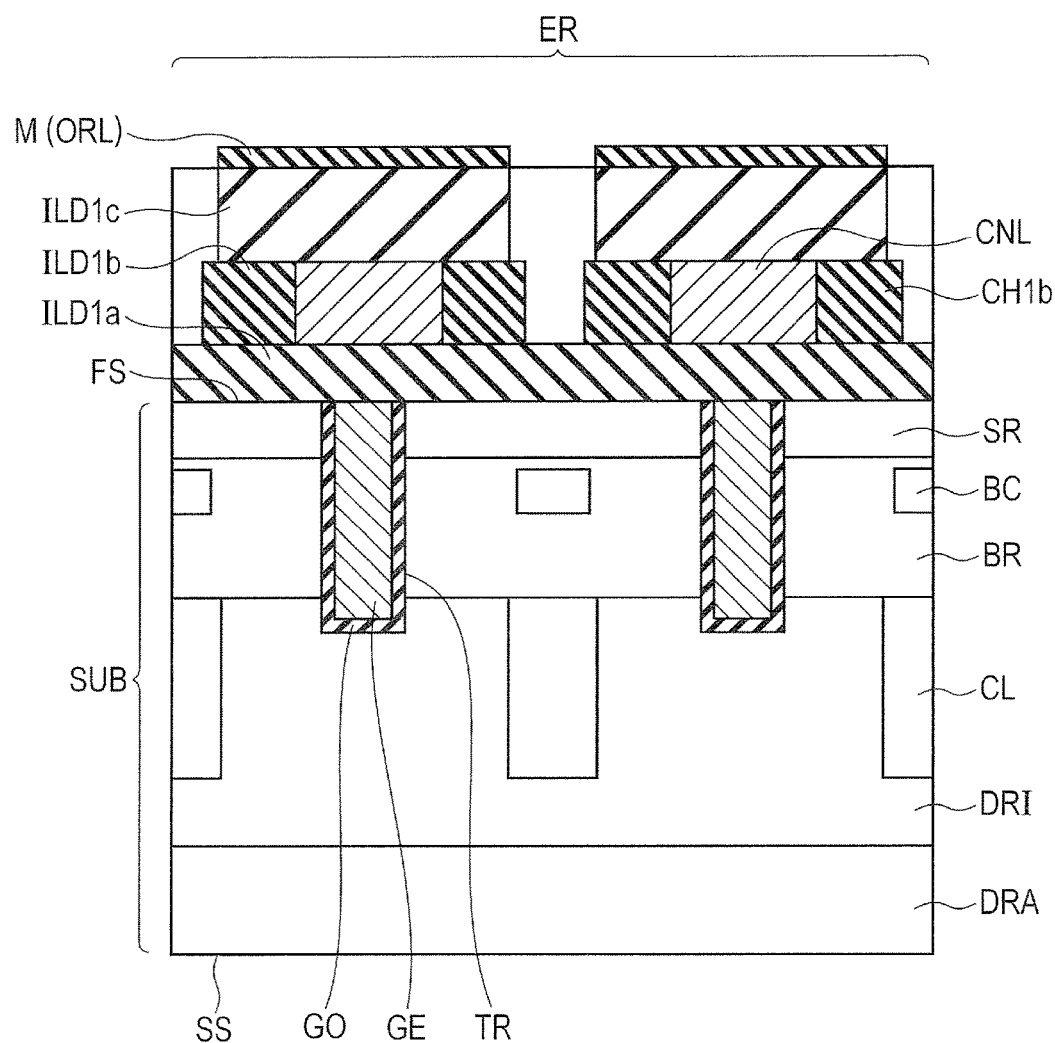
FIG. 12 is a cross-sectional view of the element region in a thermal oxidation step of the semiconductor device according to the embodiment.

As shown in FIG. 12, in the thermal oxidation step S25, the intermediate interlayer insulating film ILD1$b$ is formed. The intermediate interlayer insulating film ILD1$b$ is formed by thermally oxidizing the conductive layer CNL exposed from the side wall of the upper contact hole CH1$b$. The thermal oxidation is performed by dry oxidation or wet oxidation. The thermal oxidation is preferably performed by the wet oxidation. The thermal oxidation is more preferably performed by steam oxidation. In the thermal oxidation step S25, a cross-sectional structure of the outer peripheral region PER is not changed, so that its illustration is omitted.

Figure 13A:
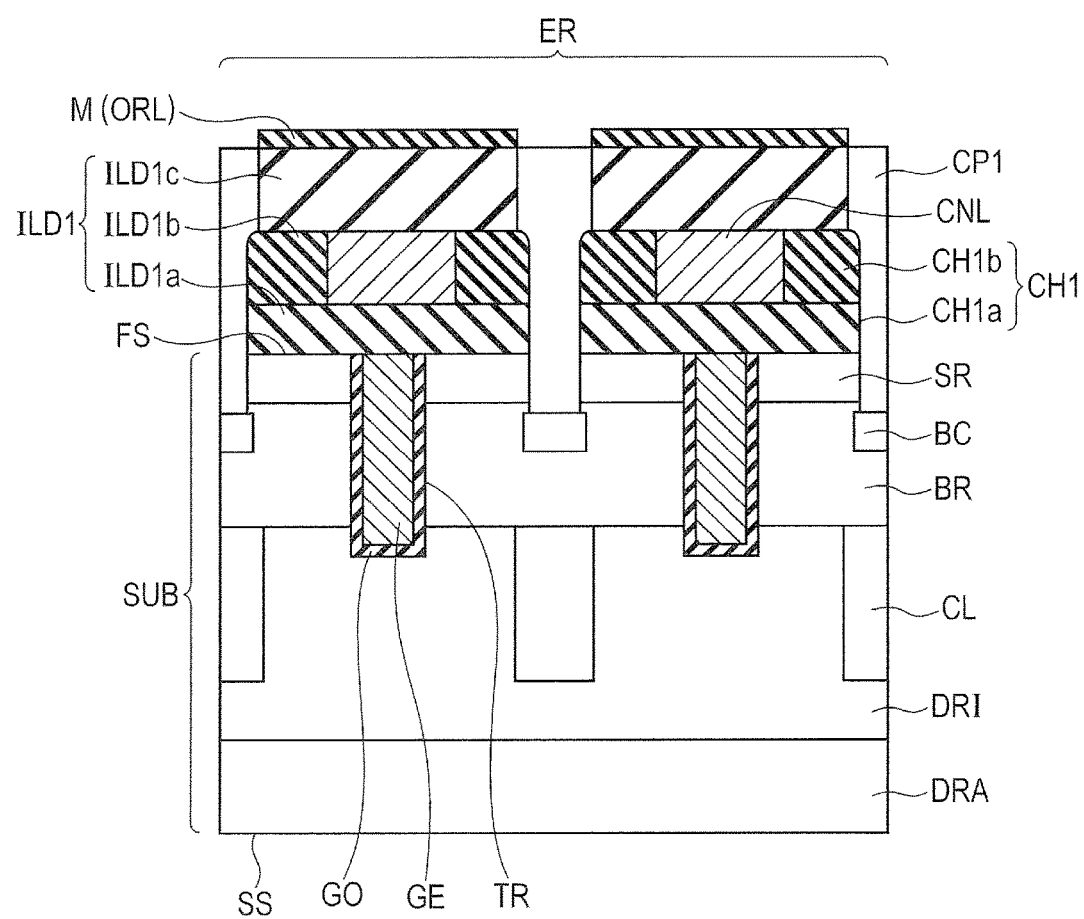
FIG. 13A is a cross-sectional view of the element region in a lower contact hole forming step of the semiconductor device according to the embodiment.

As shown in FIG. 13A, in the lower contact hole forming step S26, the lower contact hole CH1$a$ is formed. The lower contact hole CH1$a$ is formed by performing anisotropic etching such as RIE on the lower interlayer insulating film ILD1$a$ (and the semiconductor substrate SUB) through the upper contact hole CH1$b$ and the mask M.

Figure 13B:
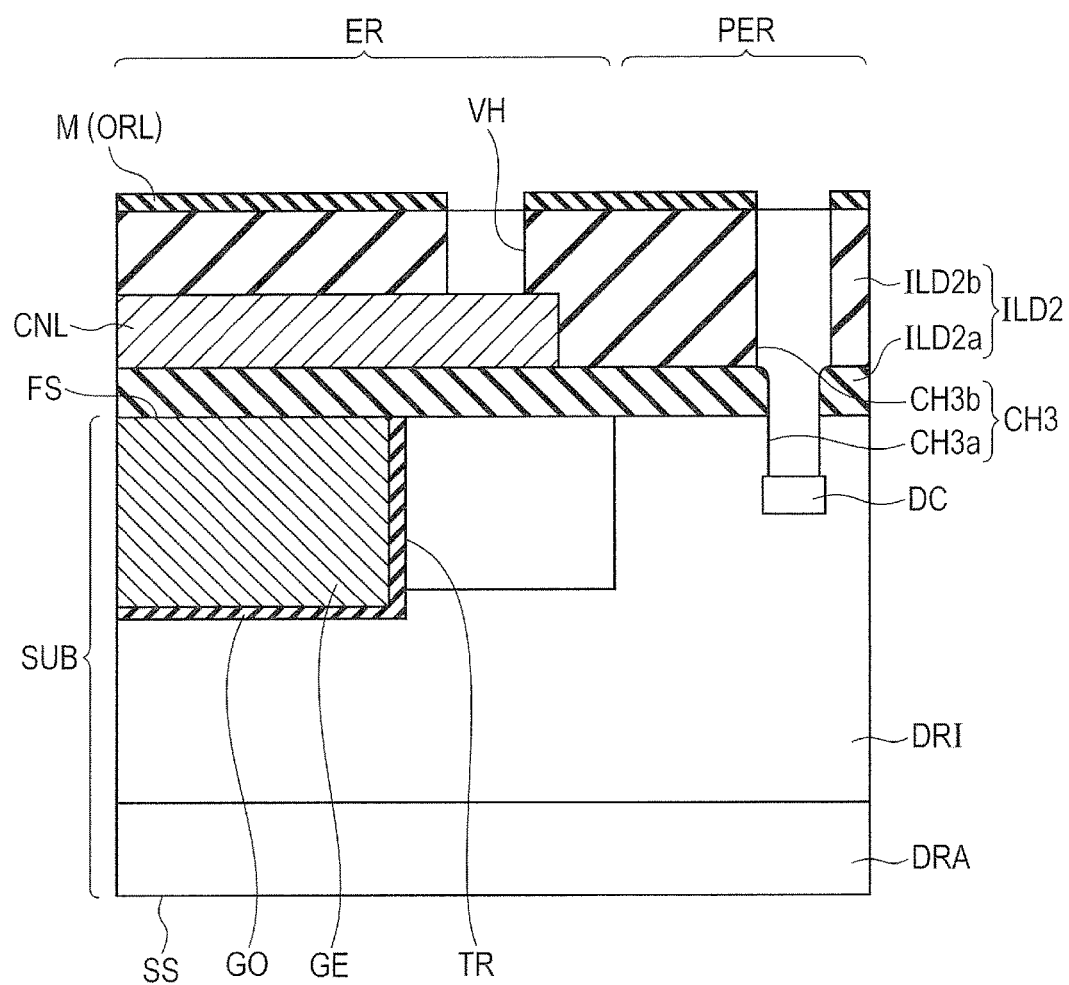
FIG. 13B is a cross-sectional view of the outer peripheral region in the lower contact hole forming step of the semiconductor device according to the embodiment.

As shown in FIG. 13B, in the lower contact hole forming step S26, the lower contact hole CH3$a$ is formed. The lower contact hole CH3$a$ is formed by performing anisotropic etching such as RIE on the lower interlayer insulating film ILD2$a$ (and the semiconductor substrate SUB) through the upper contact hole CH3$b$ and the mask M.

Although not shown in the drawings, in the lower contact hole forming step S26, the lower contact hole CH2$a$ is also formed. The lower contact hole CH2$a$ is formed by performing anisotropic etching such as RIE on the lower interlayer insulating film ILD1$a$ through the upper contact hole CH2$b$ and the mask M.

Figure 14A:
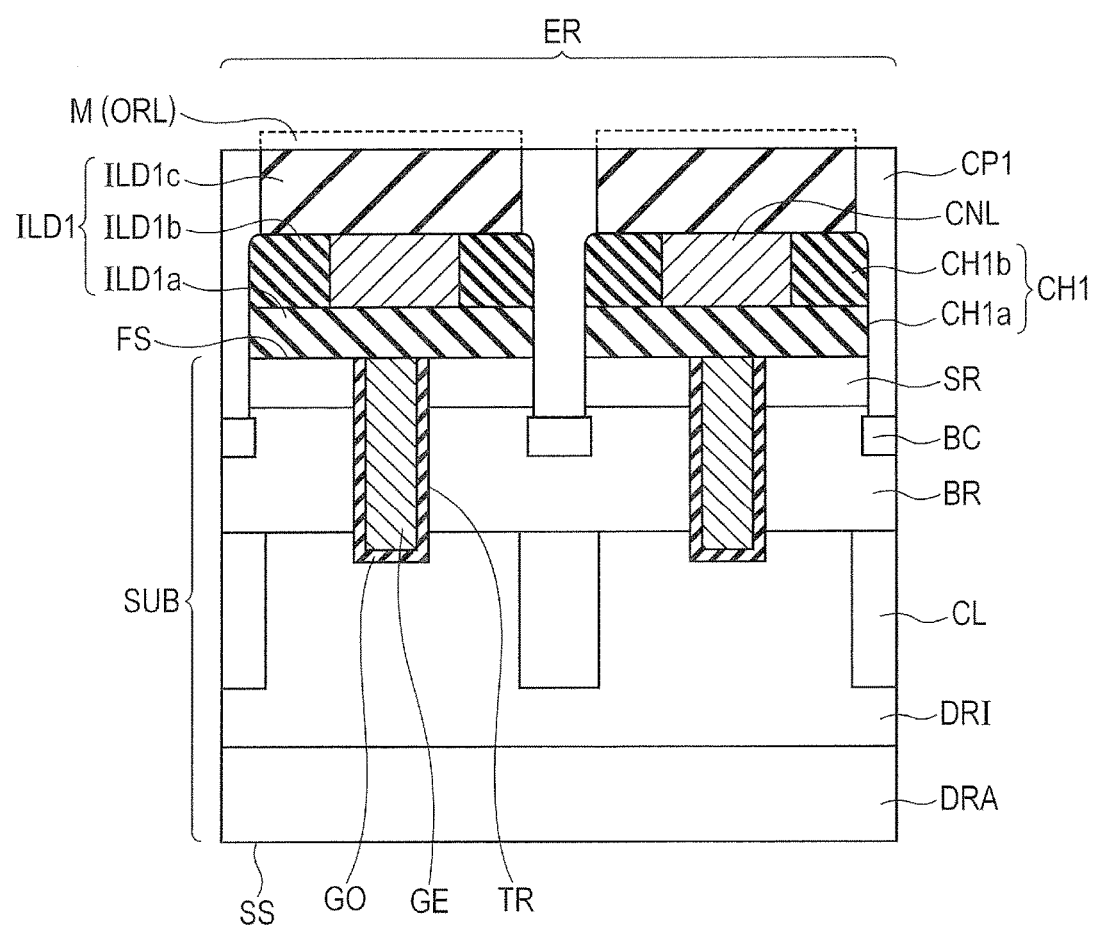
FIG. 14A is a cross-sectional view of the element region in a mask removing step of the semiconductor device according to the embodiment.
Figure 14B:
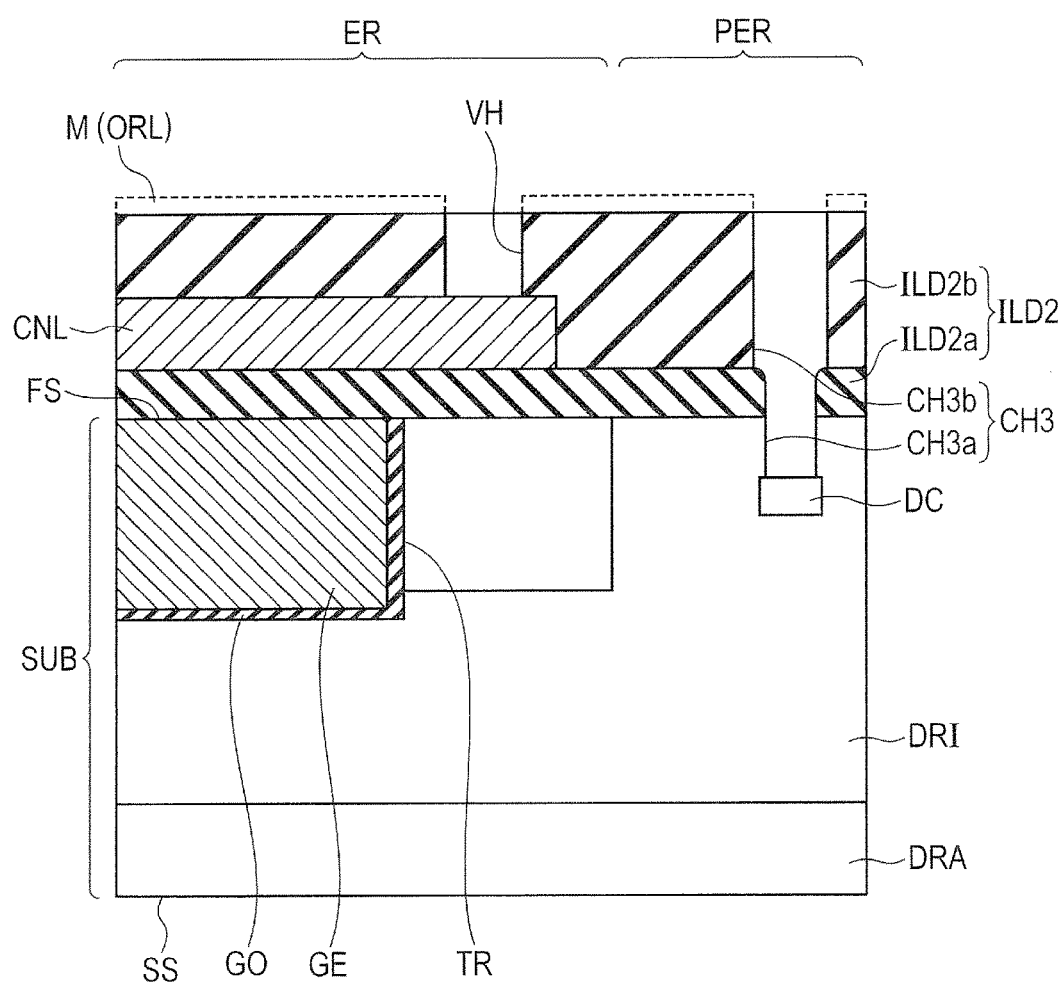
FIG. 14B is a cross-sectional view of the outer peripheral region in the mask removing step of the semiconductor device according to the embodiment.

As shown in FIGS. 14A and 14B, in the mask removing step S27, the mask M is removed. When the mask M is the oxidation-resistant film ORL, the mask M is removed by, for example, plasma etching. When the mask M is the photoresist PR, the mask M is removed by asking (incineration) processing. When the mask M is the oxidation-resistant film ORL, the mask M (the oxidation-resistant film ORL) may be remained over the upper interlayer insulating film ILD1$c$ without performing the mask removing step S27.

Figure 15A:
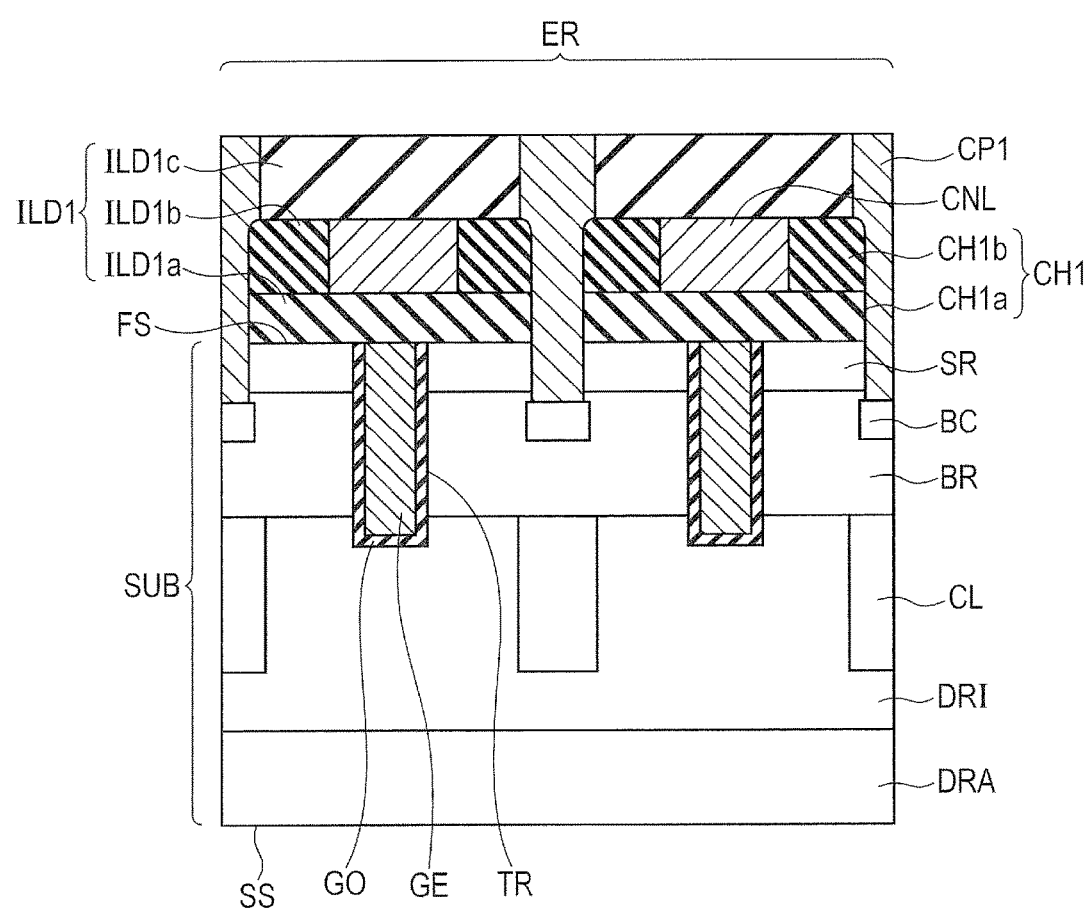
FIG. 15A is a cross-sectional view of the element region in a contact plug forming step of the semiconductor device according to the embodiment.
Figure 15B:
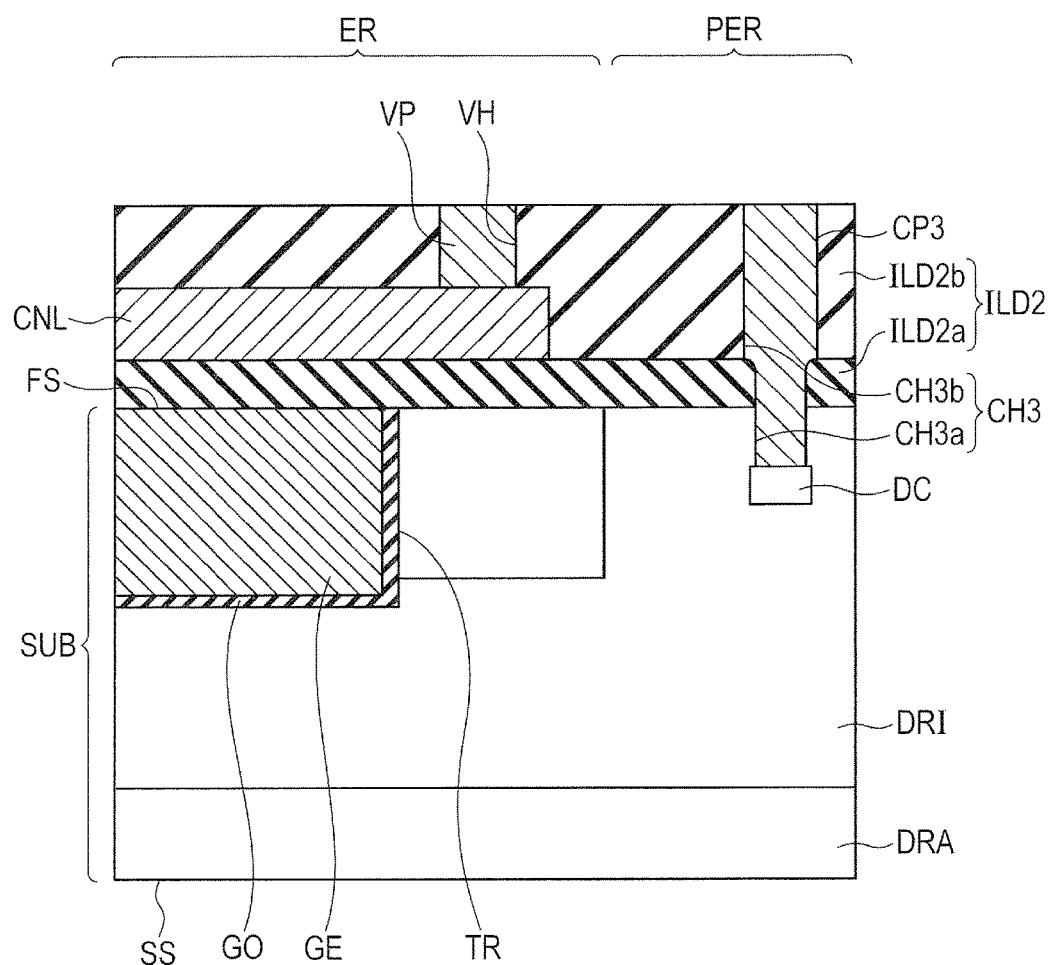
FIG. 15B is a cross-sectional view of the outer peripheral region in the contact plug forming step of the semiconductor device according to the embodiment.

As shown in FIG. 15A, in the contact plug forming step S28, the contact plug CP1 is formed in the contact hole CH1. As shown in FIG. 15B, in the contact plug forming step S28, the via plug VP is formed in the via hole VH and the contact plug CP3 is formed in the contact hole CH3. Although not shown in the drawings, in the contact plug forming step S28, the contact plug CP2 is formed in the contact hole CH2.

The contact plug CP1, the contact plug CP2, the contact plug CP3, and the via plug VP are formed by, for example, CVD and etching-back. Before forming the contact plug CP1, the contact plug CP2, the contact plug CP3, and the via plug VP, a barrier layer formed of Ti, TiN, or the like may be formed over surfaces of the contact hole CH1, the contact hole CH2, the contact hole CH3, and the via hole VH by sputtering or the like.

Figure 16A:
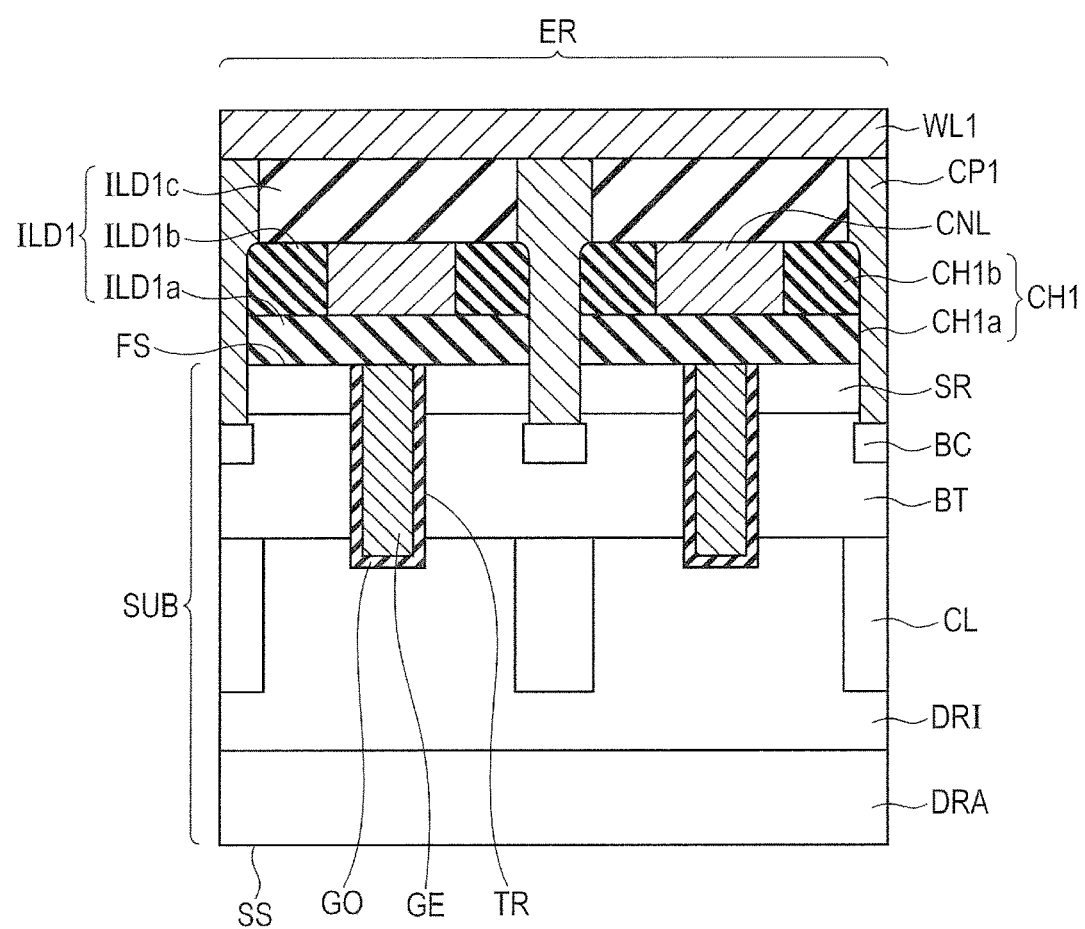
FIG. 16A is a cross-sectional view of the element region in a wiring forming step of the semiconductor device according to the embodiment.
Figure 16B:
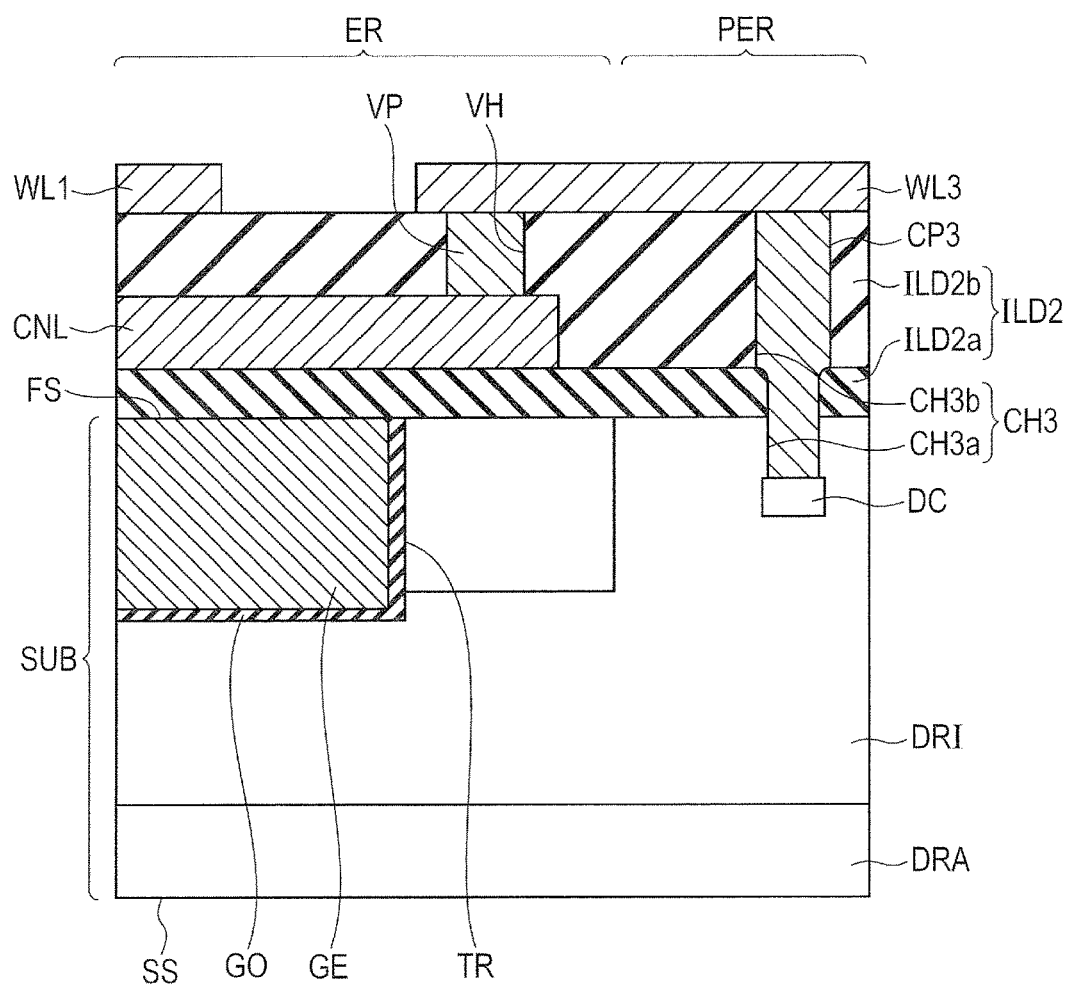
FIG. 16B is a cross-sectional view of the outer peripheral region in the wiring forming step of the semiconductor device according to the embodiment.

As shown in FIGS. 16A and 16B, in the wiring forming step S29, the wiring line WL1, the wiring line WL2 (not shown in the drawings), and the wiring line WL3 are formed over the interlayer insulating film ILD1 and the interlayer insulating film ILD2. The wiring line WL1, the wiring line WL2, and the wiring line WL3 are formed by using, for example, sputtering and photolithography.

Figure 17A:
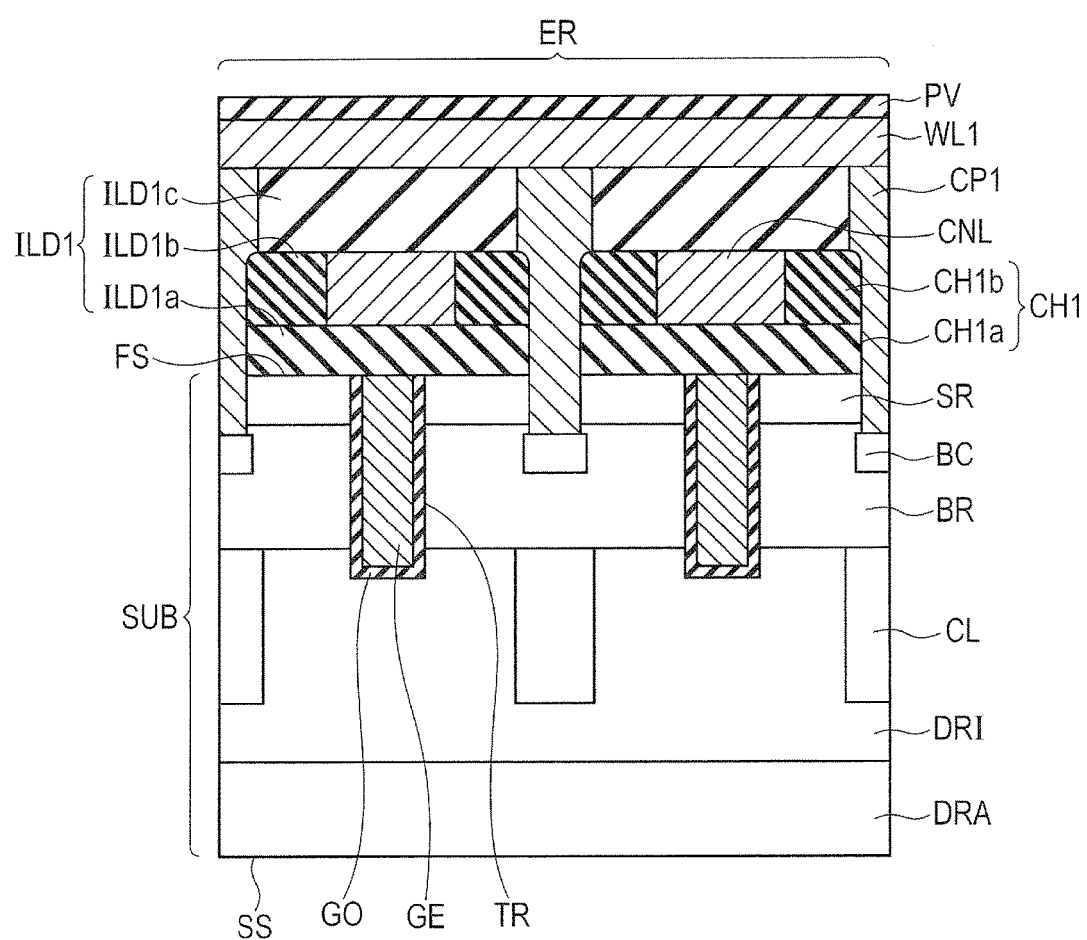
FIG. 17A is a cross-sectional view of the element region in a protective film forming step of the semiconductor device according to the embodiment.
Figure 17B:
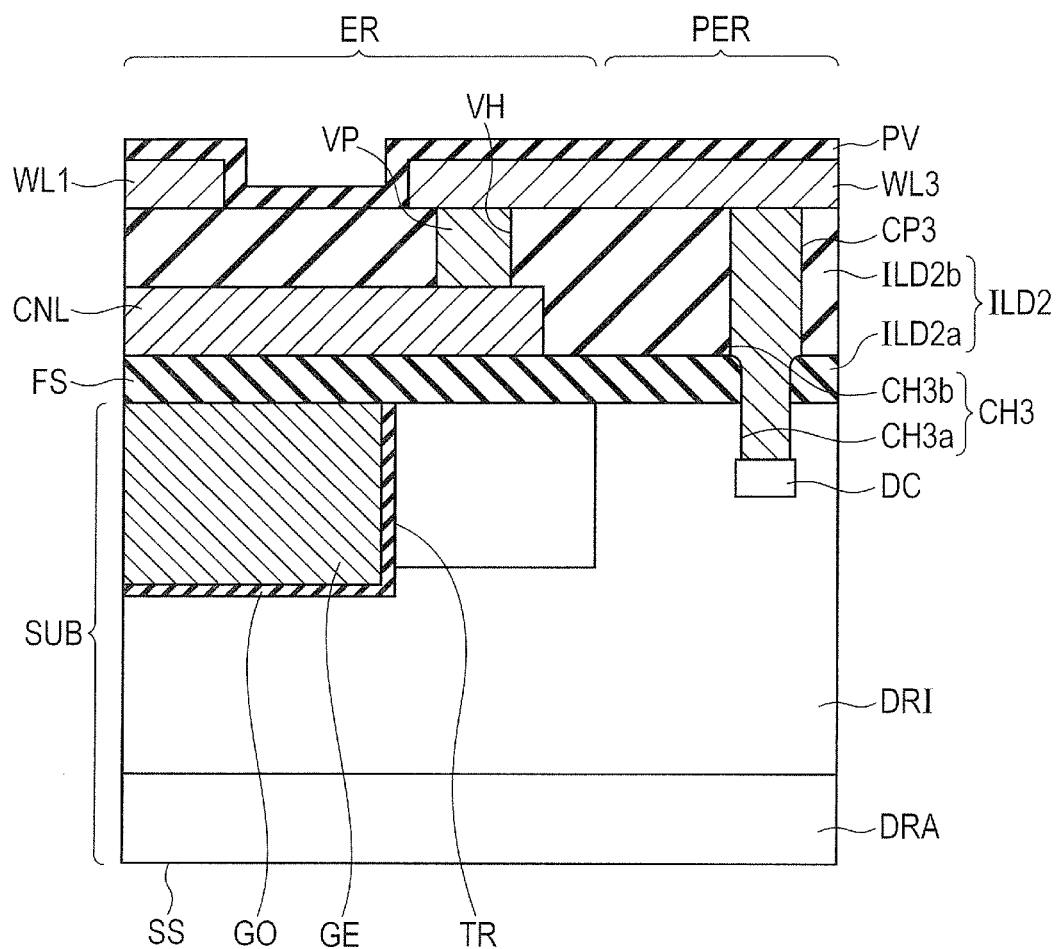
FIG. 17B is a cross-sectional view of the outer peripheral region in the protective film forming step of the semiconductor device according to the embodiment.

As shown in FIGS. 17A and 17B, after the wiring forming step S29, a protective film PV may be formed over portions of the interlayer insulating film ILD1 and the interlayer insulating film ILD2 where the wiring line WL1, the wiring line WL2, the wiring line WL3, and each wiring line are not formed. The protective film PV is formed of, for example, SiON and polyimide. Thus, the steps of the method of manufacturing a semiconductor device according to the embodiment are completed.

Hereinafter, effects of the semiconductor device according to the embodiment will be described.

As described above, in the semiconductor device according to the embodiment, the contact plug CP1 having the same potential as that of the source region SR and the conductive layer CNL having the same potential as that of the drain region DRA face each other while being insulated from each other by the intermediate interlayer insulating film ILD1$b$. As described above, in the semiconductor device according to the embodiment, the wiring line WL1 having the same potential as that of the source region SR and the conductive layer CNL having the same potential as that of the drain region DRA face each other while being insulated from each other by the upper interlayer insulating film ILD1$c$.

Figure 18:
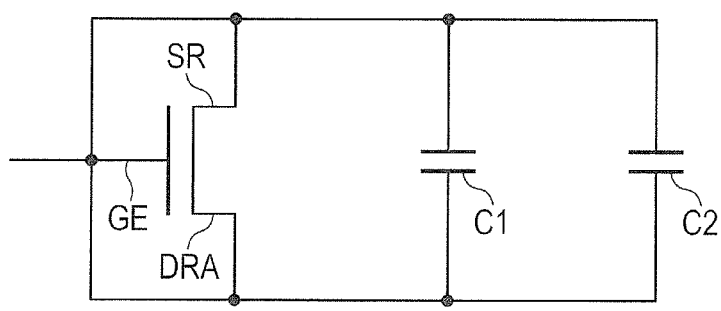
FIG. 18 is an equivalent circuit diagram of the semiconductor device according to the embodiment.

Therefore, as shown in FIG. 18, the contact plug CP1, the conductive layer CNL, and the intermediate interlayer insulating film ILD1$b$ form a source-drain capacitance C1 and the wiring line WL1, the conductive layer CNL, and the upper interlayer insulating film ILD1$c$ form a source-drain capacitance C2. The capacitance C1 and the capacitance C2 are formed by the wiring WL1, the conductive layer CNL, and the interlayer insulating film ILD1, so that the capacitance 1 and the capacitance C2 are arranged in the element region ER. The capacitance C1 and the capacitance C2 can be formed by adding only the conductive layer forming step S21 and the thermal oxidation step S25 to a normal back end step, so that it is not necessary to add a large change to the back end step. Therefore, according to the semiconductor device according to the embodiment, it is possible to reduce effects of noise without complicating processes and increasing the chip area.

Hereinafter, more detailed effects of the semiconductor device according to the embodiment will be described by comparing the semiconductor device with a comparative example.

Figure 19:
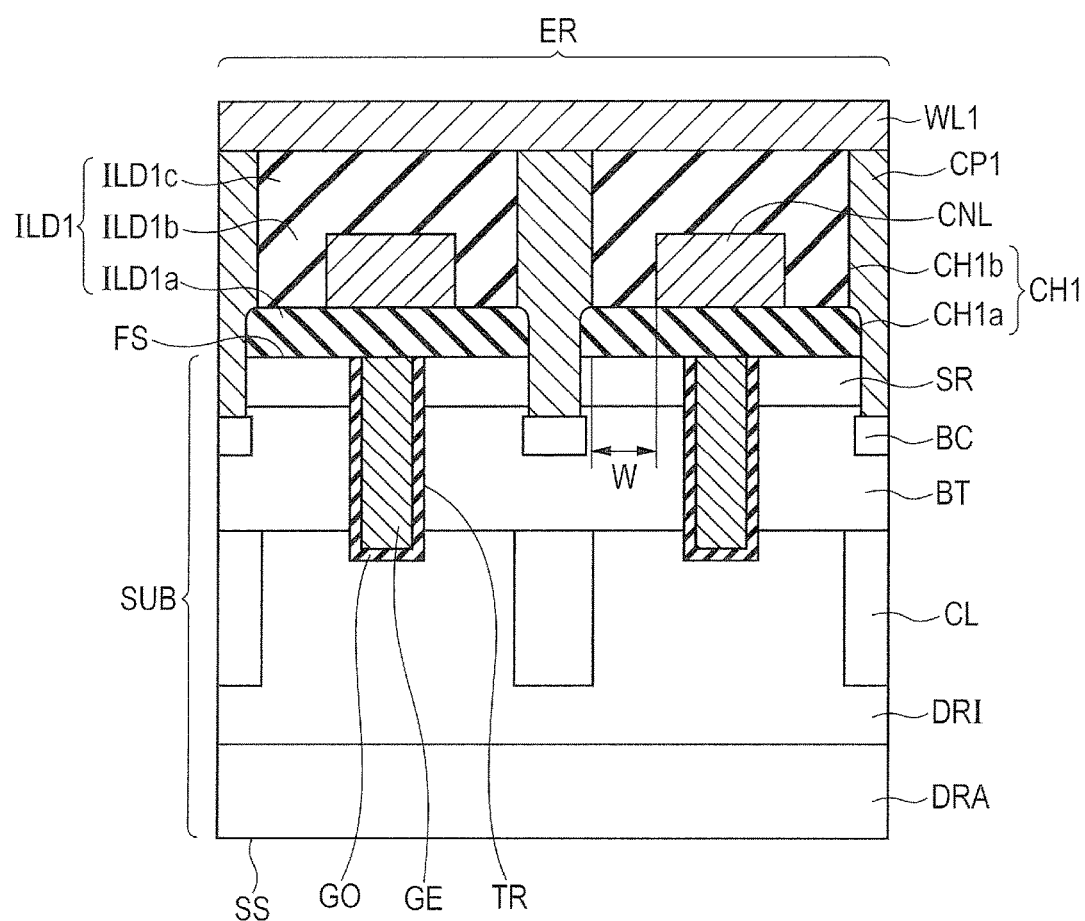
FIG. 19 is a cross-sectional view of an element region of a semiconductor device according to a comparative example.

As shown in FIG. 19, a semiconductor device according to the comparative example has the semiconductor substrate SUB, the interlayer insulating film ILD1, the conductive layer CNL, the contact plug CP1, and the wiring line WL1. In the semiconductor substrate SUB, the drain region DRA, the drift region DRI, the base region BR, and the source region SR are formed. The interlayer insulating film ILD1 includes the lower interlayer insulating film ILD1a, the intermediate interlayer insulating film ILD1b, and the upper interlayer insulating film ILD1c.

The contact plug CP1 and the conductive layer CNL face each other while being insulated from each other by the intermediate interlayer insulating film ILD1b and the wiring line WL1 and the conductive layer CNL face each other while being insulated from each other by the upper interlayer insulating film ILD1c. n these points, the semiconductor device according to the embodiment and the semiconductor device according to the comparative example have the same configuration.

However, the semiconductor device according to the comparative example is different from the semiconductor device according to the embodiment in that the conductive layer CNL is formed of the same material (for example, W) as that of the contact plug CP1 and in that the intermediate interlayer insulating film ILD1b is formed of a CVD film.

Normally, film quality of the CVD film varies largely. Therefore, in the semiconductor device according to the comparative example, the capacitance C1 varies due to such variation of the film quality. Further, normally, the insulating resistance of the CVD film is lower than that of a thermal oxide film. Therefore, in the semiconductor device according to the comparative example, the insulating resistance of the intermediate interlayer insulating film ILD1b may be insufficient. On the other hand, the thermal oxide film has high insulating resistance because the thermal oxide film has high denseness. Further, the variation of film quality of the thermal oxide film is small. Therefore, in the semiconductor device according to the embodiment, it is possible to suppress variation of the capacitance C1 and it is possible to secure the insulating resistance of the intermediate interlayer insulating film ILD1b.

In the semiconductor device according to the comparative example, the width W of the intermediate interlayer insulating film ILD1b is determined by the width of the upper contact hole CH1b. The width of the upper contact hole CH1b is determined by the accuracy of the photolithography. Therefore, the width W of the intermediate interlayer insulating film ILD1b depends on the accuracy of the photolithography. On the other hand, in the semiconductor device according to the embodiment, the intermediate interlayer insulating film ILD1b is formed by thermal oxidation in a self aligning manner. In other words, in the semiconductor device according to the embodiment, the width W of the intermediate interlayer insulating film ILD1b depends on thermal oxidation conditions.

Normally, control of the film thickness by the thermal oxidation can be more accurately performed than control of the film thickness by the photolithography. Therefore, according to the semiconductor device according to the embodiment, it is possible to suppress variation of the capacitance C1 due to variation of the width W of the intermediate interlayer insulating film ILD1b.

Further, when forming the structure of the semiconductor device according to the comparative example, the number of steps of the back end step increases as compared with forming the structure of the semiconductor device according to the embodiment. Therefore, according to the semiconductor device according to the embodiment, it is possible to reduce the number of steps of the back end step.

When a semiconductor device has a super junction structure, it is possible to increase the withstand voltage and lower the on-resistance as compared with a case where the semiconductor device has no super junction structure. However, noise occurs more easily. Therefore, when the semiconductor device according to the embodiment has the column region CL, it is possible to suppress effects of noise while increasing the withstand voltage and lowering the on-resistance.

When an element to be a donner is doped into Si as an impurity, it is possible to improve carrier movability as compared with a case where an element to be an acceptor is added as an impurity. Therefore, when an element to be a donner is doped into polycrystalline Si used for the conductive layer CNL, it is possible to vary a resistance value of the conductive layer CNL over a wide range by appropriately selecting an impurity concentration.

Adding a resistive element in series to the capacitance C1 is effective to reduce noise in the semiconductor device according to the embodiment. This is because noise is attenuated by causing noise induced to the capacitance C1 to pass through the resistive element added in series to the capacitance C1. Conversely, when a resistance value of the resistive element added in series to the capacitance C1 is not appropriate, suppression of noise may be insufficient. As described above, when an element to be a donner is doped into polycrystalline Si used for the conductive layer CNL (when the conductivity type of the polycrystalline Si used for the conductive layer CNL is n-type), it is possible to vary the resistance value of the conductive layer CNL over a wide range. Therefore, the conductive layer CNL can be a resistive element added in series to the capacitance C1. As a result, in the semiconductor device according to the embodiment, it is not necessary to separately form a resistive element that is added in series to the capacitance C1, so that the manufacturing process can be simplified.

In the method of manufacturing a semiconductor device according to the embodiment, when the thermal oxidation is performed by wet oxidation, an oxidation rate of the conductive layer CNL increases. As a result, in the method of manufacturing a semiconductor device according to the embodiment, when the thermal oxidation is performed by wet oxidation, it is possible to complete the thermal oxidation within a shorter period of time. Therefore, in this case, it is possible to further suppress change of impurity profile in the semiconductor substrate SUB.

In the method of manufacturing a semiconductor device according to the embodiment, when the mask M is formed of the oxidation-resistant film ORL, an upper side (a side facing the upper interlayer insulating film ILD1c0) of the conductive layer CNL becomes difficult to be oxidized. Therefore, it is possible to suppress excessive oxidization of the upper side of the conductive layer CNL.

In the method of manufacturing a semiconductor device according to the embodiment, when the mask M is formed of the oxidation-resistant film ORL, even if the mask M is not removed, the mask M hardly ill-affects the semiconductor device according to the embodiment. Therefore, in the method of manufacturing a semiconductor device according to the embodiment, when the mask M is formed of the oxidation-resistant film ORL and the mask removing step S27 is not performed, it is possible to reduce the number of steps.

While the invention made by the inventors has been specifically described based on the embodiment, it is needless to say that the present invention is not limited to the embodiment and may be variously modified without departing from the scope of the invention.

What is claimed is:

1. A semiconductor device comprising:
   a semiconductor substrate having a first surface and a second surface that is an opposite surface of the first surface;
   a drain region which is arranged in the semiconductor substrate and has a first conductivity type;
   a drift region which is arranged on a side of the drain region facing the first surface in the semiconductor substrate and has the first conductivity type;
   a base region which is arranged on a side of the drift region facing the first surface in the semiconductor substrate and has a second conductivity type opposite to the first conductivity type;
   a source region which is arranged on a side of the base region facing the first surface so that the base region is sandwiched between the source region and the drift region in the semiconductor substrate and which has the first conductivity type;
   a gate electrode which faces a part of the base region sandwiched between the source region and the drift region while being insulated from the part of the base region;
   an interlayer insulating film which is arranged over the first surface;
   a conductive layer which is arranged in the interlayer insulating film and is electrically coupled to the drain region;
   a wiring line which is arranged over the interlayer insulating film; and
   a contact plug which is arranged in the interlayer insulating film and is electrically coupled to the wiring line and the source region,
   wherein the interlayer insulating film has an intermediate interlayer insulating film arranged between the conductive layer and the contact plug,
   wherein the conductive layer is formed of a conductor which changes into an insulator when being oxidized, and
   wherein the intermediate interlayer insulating film is a thermal oxide film of a material that forms the conductive layer.

2. The semiconductor device according to claim 1, further comprising: a column region which extends from the base region toward the second surface and has the second conductivity type.

3. The semiconductor device according to claim 1,
   wherein the interlayer insulating film further includes an upper interlayer insulating film which is arranged on a side of the conductive layer facing the wiring line, and
   wherein the semiconductor device further includes an oxidation-resistant film which is arranged over the upper interlayer insulating film and is formed of a material that is more difficult to be oxidized than the upper interlayer insulating film.

4. The semiconductor device according to claim 1,
   wherein the interlayer insulating film further includes a lower interlayer insulating film which is arranged on a side of the conductive layer facing the first surface and an upper interlayer insulating film which is arranged on a side of the conductive layer facing the wiring line, and
   wherein the upper interlayer insulating film and the lower interlayer insulating film are CVD films.

5. The semiconductor device according to claim 4,
   wherein the conductive layer is formed of a polycrystalline silicon in which impurities are doped.

6. The semiconductor device according to claim 5,
   wherein the impurities are elements to be donors of the polycrystalline silicon.

7. A method of manufacturing a semiconductor device, the method comprising the step of:
   preparing a semiconductor substrate having a first surface and a second surface that is a surface opposite to the first surface,
   wherein in the semiconductor substrate,
   a drain region which has a first conductivity type,
   a drift region which is arranged on a side of the drain region facing the first surface and has the first conductivity type,
   a base region which is arranged on a side of the drift region facing the first surface and has a second conductivity type opposite to the first conductivity type, and
   a source region which is arranged on a side of the base region facing the first surface so that the base region is sandwiched between the source region and the drift region and which has the first conductivity type, are formed, and
   wherein the method further includes the steps of
   forming a gate electrode which faces a part of the base region sandwiched between the source region and the drift region while being insulated from the part of the base region,
   forming a lower interlayer insulating film over the first surface,
   forming a conductive layer over the lower interlayer insulating film,
   forming an upper interlayer insulating film over the conductive layer,
   forming a mask having an opening over the upper interlayer insulating film,
   forming an upper contact hole that penetrates the upper interlayer insulating film and the conductive layer by etching the upper interlayer insulating film and the conductive layer through the opening and exposing the conductive layer from a side wall of the contact hole, and
   forming an intermediate interlayer insulating film by thermally oxidizing the conductive layer exposed from the side wall.

8. The method of manufacturing a semiconductor device according to claim 7,
   wherein the thermal oxidation is wet oxidation.

9. The method of manufacturing a semiconductor device according to claim 7, further comprising the step of: after forming the intermediate interlayer insulating film, removing the mask.

10. The method of manufacturing a semiconductor device according to claim 7,
    wherein the mask is an oxidation-resistant film formed of a material that is more difficult to be oxidized than the upper interlayer insulating film.

11. The method of manufacturing a semiconductor device according to claim 10,
    wherein the upper interlayer insulating film is a silicon oxide film, and
    wherein the oxidation-resistant film is a silicon nitride film or a silicon oxynitride film.

12. The method of manufacturing a semiconductor device according to claim 10, further comprising the step of: after forming the mask, forming a wiring line over the mask.

* * * * *